(12) United States Patent
El-Mansouri et al.

(10) Patent No.: US 11,699,475 B2
(45) Date of Patent: Jul. 11, 2023

(54) FERROELECTRIC MEMORY PLATE POWER REDUCTION

(71) Applicant: Micron Technology, Inc., Boise, ID (US)

(72) Inventors: Adam S. El-Mansouri, Boise, ID (US); David L. Pinney, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/236,724

(22) Filed: Apr. 21, 2021

(65) Prior Publication Data

US 2021/0312967 A1 Oct. 7, 2021

Related U.S. Application Data

(62) Division of application No. 16/813,319, filed on Mar. 9, 2020, now Pat. No. 10,998,026, which is a division
(Continued)

(51) Int. Cl.
*G11C 11/22* (2006.01)
*G11C 8/10* (2006.01)
*G11C 8/08* (2006.01)

(52) U.S. Cl.
CPC .............. *G11C 11/221* (2013.01); *G11C 8/08* (2013.01); *G11C 8/10* (2013.01); *G11C 11/2255* (2013.01);
(Continued)

(58) Field of Classification Search
USPC .................................................. 365/145, 203
See application file for complete search history.

(56) References Cited

U.S. PATENT DOCUMENTS 786,348 A * 4/1905 Dreyfus ................... C10M 1/08
106/285
4,873,664 A 10/1989 Eaton
(Continued)

FOREIGN PATENT DOCUMENTS

CN 1157458 A 8/1997
CN 1459795 A 12/2003
(Continued)

OTHER PUBLICATIONS

Chinese Patent Office, "Office Action and Search Report", issued in connection with Chinese Patent Application No. 201910378934.1 dated Sep. 5, 2022 (12 pages).
(Continued)

*Primary Examiner* — Viet Q Nguyen
(74) *Attorney, Agent, or Firm* — Holland & Hart LLP

(57) ABSTRACT

Methods, systems, and devices for ferroelectric memory plate power reduction are described. A plate line may be coupled with a voltage source, a capacitor, and one or more sections of a bank of ferroelectric memory cells. During a write operation, the capacitor may be discharged onto the plate line and the resulting voltage may be adjusted (e.g., increased) by the voltage source before writing one or more memory cells. During a write-back operation, a capacitor associated with one or more memory cells may be discharged onto the plate line and stored at the capacitor. The charge may be re-applied to the plate line and adjusted (e.g., increased) by the voltage source during the write-back.

20 Claims, 11 Drawing Sheets

Related U.S. Application Data of application No. 15/975,628, filed on May 9, 2018, now Pat. No. 10,622,050.

(52) U.S. Cl.
CPC ...... *G11C 11/2257* (2013.01); *G11C 11/2259* (2013.01); *G11C 11/2273* (2013.01); *G11C 11/2275* (2013.01); *G11C 11/2293* (2013.01)

(56) References Cited

U.S. PATENT DOCUMENTS

| | | | |
|---|---|---|---|
| 5,218,566 A | 6/1993 | Papaliolios | |
| 5,574,679 A | 11/1996 | Ohtsuki et al. | |
| 5,579,257 A | 11/1996 | Tai | |
| 6,078,529 A | 6/2000 | Tada | |
| 6,181,620 B1 | 1/2001 | Agata et al. | |
| 6,292,386 B1 | 9/2001 | Hoenigschmid | |
| 6,297,985 B1 | 10/2001 | Kang | |
| 6,459,609 B1 | 10/2002 | Du | |
| 6,757,186 B2 | 6/2004 | Lin | |
| 6,859,380 B2 | 2/2005 | Ashikaga | |
| 6,909,626 B2 | 6/2005 | Torrisi et al. | |
| 7,403,813 B1 * | 7/2008 | Farazi | A61B 5/364 600/515 |
| 7,545,696 B2 | 6/2009 | Yamaoka | |
| 9,715,918 B1 | 7/2017 | Kawamura | |
| 9,715,919 B1 | 7/2017 | Ingalls et al. | |
| 9,721,638 B1 | 8/2017 | Kawamura et al. | |
| 9,786,345 B1 | 10/2017 | Thiruvengadam et al. | |
| 9,786,347 B1 | 10/2017 | Kawamura et al. | |
| 9,786,348 B1 | 10/2017 | Kawamura et al. | |
| 9,786,349 B1 | 10/2017 | Calderoni et al. | |
| 9,792,973 B2 | 10/2017 | Kawamura et al. | |
| 9,799,388 B1 | 10/2017 | Carman | |
| 10,049,713 B2 | 8/2018 | Di Vincenzo et al. | |
| 10,074,422 B1 | 9/2018 | Tandingan et al. | |
| 10,153,020 B1 | 12/2018 | Vimercati | |
| 10,163,480 B1 | 12/2018 | Kawamura et al. | |
| 10,360,966 B2 | 7/2019 | Derner et al. | |
| 10,395,717 B2 * | 8/2019 | Di Vincenzo | G11C 11/221 |
| 10,446,220 B1 | 10/2019 | Guo et al. | |
| 10,622,050 B2 * | 4/2020 | El-Mansouri | G11C 8/10 |
| 10,622,650 B2 | 4/2020 | Bozzolo et al. | |
| 10,692,557 B1 | 6/2020 | Bolandrina et al. | |
| 10,726,917 B1 | 7/2020 | Bedeschi et al. | |
| 10,855,295 B2 | 12/2020 | Fackenthal et al. | |
| 10,878,874 B2 | 12/2020 | Hattori et al. | |
| 10,896,713 B2 * | 1/2021 | Vimercati | G11C 11/2275 |
| 10,998,026 B2 * | 5/2021 | El-Mansouri | G11C 11/2259 |
| 11,004,493 B1 * | 5/2021 | Vimercati | G11C 11/221 |
| 2003/0076704 A1 | 4/2003 | Ashikaga | |
| 2003/0179610 A1 | 9/2003 | Sakai | |
| 2003/0218899 A1 | 11/2003 | Jeon et al. | |
| 2003/0234413 A1 | 12/2003 | Sberno et al. | |
| 2004/0047174 A1 | 3/2004 | Chen et al. | |
| 2004/0076031 A1 | 4/2004 | Roehr et al. | |
| 2004/0076054 A1 | 4/2004 | Takahashi | |
| 2004/0105296 A1 | 6/2004 | Tom Ho | |
| 2005/0152193 A1 | 7/2005 | Sakai | |
| 2005/0157531 A1 | 7/2005 | Yamaoka et al. | |
| 2005/0259461 A1 | 11/2005 | Yamaoka et al. | |
| 2005/0286289 A1 | 12/2005 | Watanabe | |
| 2006/0067101 A1 | 3/2006 | Sakai | |
| 2006/0171186 A1 | 8/2006 | Yamaoka | |
| 2010/0128515 A1 | 5/2010 | Fukushi | |
| 2011/0317507 A1 | 12/2011 | Nakazawa | |
| 2014/0247642 A1 | 9/2014 | Madhan et al. | |
| 2015/0109875 A1 | 4/2015 | Okuda et al. | |
| 2015/0128515 A1 | 5/2015 | Meyer | |
| 2016/0086648 A1 | 3/2016 | Dol | |
| 2016/0260489 A1 | 9/2016 | Lee et al. | |
| 2017/0098478 A1 | 4/2017 | Lee et al. | |
| 2017/0270991 A1 | 9/2017 | Kawamura et al. | |
| 2017/0352397 A1 | 12/2017 | Guo et al. | |
| 2018/0061470 A1 | 3/2018 | Di Vincenzo et al. | |
| 2018/0308538 A1 | 10/2018 | Vo et al. | |
| 2018/0366174 A1 | 12/2018 | Liu | |
| 2019/0027204 A1 | 1/2019 | Kim et al. | |
| 2019/0043564 A1 | 2/2019 | Madraswala et al. | |
| 2019/0051335 A1 | 2/2019 | Nagata | |
| 2019/0066753 A1 | 2/2019 | Muzzetto | |

FOREIGN PATENT DOCUMENTS

| | | | |
|---|---|---|---|
| CN | 1466763 A | 1/2004 | |
| CN | 1643611 A | 7/2005 | |
| CN | 1645512 A | 7/2005 | |
| CN | 1666293 A | 9/2005 | |
| CN | 1700473 A | 11/2005 | |
| CN | 1722299 A | 1/2006 | |
| CN | 1734665 A | 2/2006 | |
| JP | 2007-080403 A | 3/2007 | |
| JP | 2007-193939 A | 8/2007 | |
| JP | 6820953 B2 * | 1/2021 | ........... G11C 11/221 |
| NO | 20031364 L | 9/2004 | |

OTHER PUBLICATIONS

Chinese Patent Office, "Office Action," issued in connection with Chinese Patent Application No. 201910319023.1 dated Sep. 1, 2022 (6 pages).

Jianjun, Li et al., "Memory Elements and Theirs Operating Processes of Ferroelectric Memory", Computer & Digital Engineering, No. 1, Jan. 20, 2006.

Nakagawa, T. et al., "A low power 6T-4C non-volatile memory using charge sharing and non-precharge techniques", 2015 IEEE International Symposium on Circuits and Systems (ISCAS), Jul. 30, 2015.

* cited by examiner

FERROELECTRIC MEMORY PLATE POWER REDUCTION

CROSS REFERENCE

The present Application for Patent is a divisional of U.S. patent application Ser. No. 16/813,319 by El-Mansouri et al., entitled "Ferroelectric Memory Plate Power Reduction," filed Mar. 9, 2020, which is a divisional of U.S. patent application Ser. No. 15/975,628 by El-Mansouri et al., entitled "Ferroelectric Memory Plate Power Reduction," filed May 9, 2018, assigned to the assignee hereof, and each of which is expressly incorporated by reference herein.

BACKGROUND

The following relates generally to operating a memory array and more specifically to ferroelectric memory plate power reduction.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics. Improvements in memory architecture or operation may be directed to problems related to power consumption associated with access operations of ferroelectric memory arrays.

DETAILED DESCRIPTION

Figure 1:
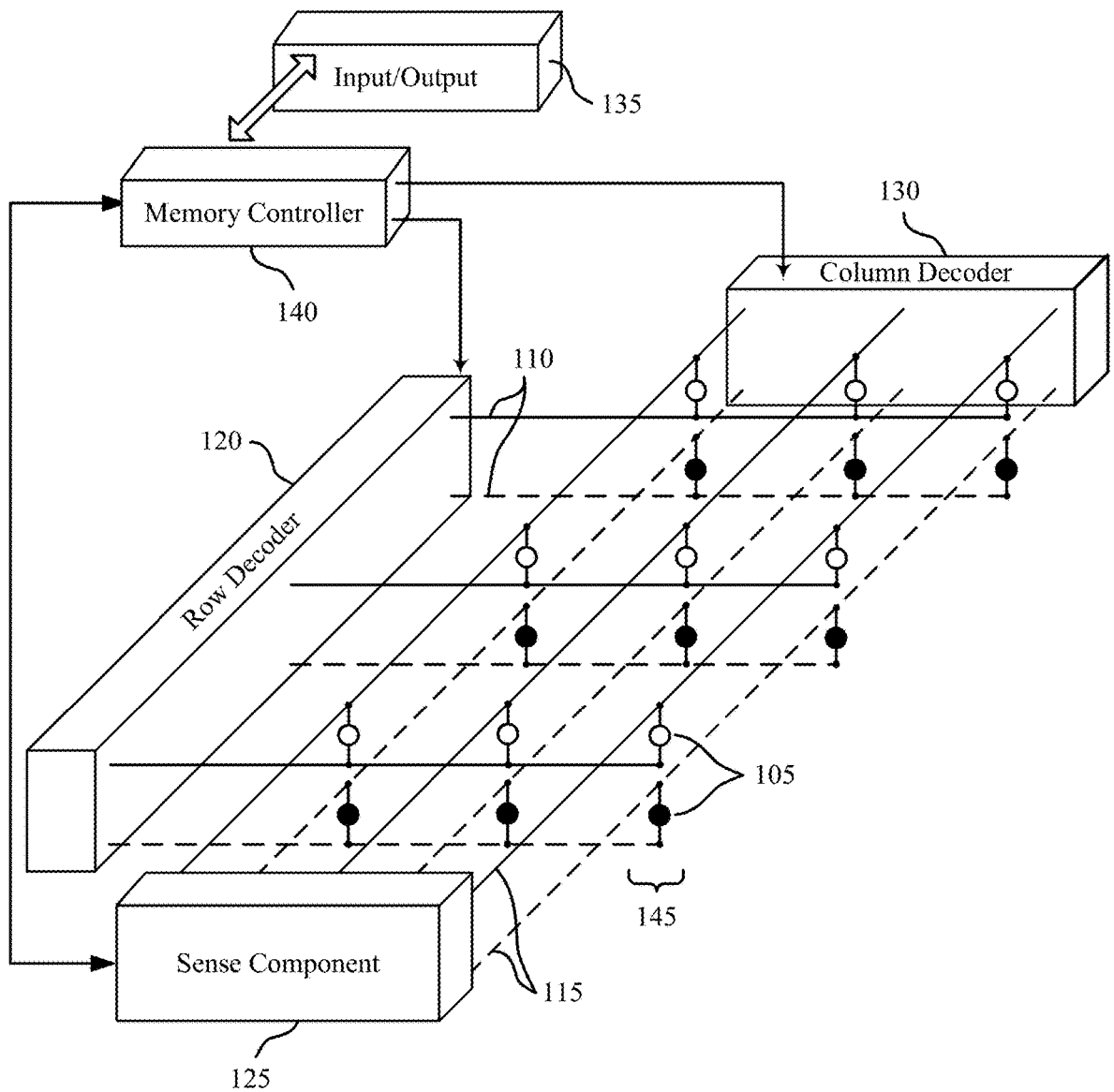
FIG. 1 illustrates an example of a memory array that supports ferroelectric memory plate power reduction in accordance with examples of the present disclosure.

In a bank of ferroelectric memory cells, plate lines may be utilized to initiate access operations on the memory cells. Because a plate line may initiate a variety of types of access operations (e.g., read operations or write operations), the plate line may be referred to as a dynamic plate line. Stated another way, a value of a voltage applied across a plate line may differ depending on the type of access operation being performed. Thus, a range of voltages are commonly applied across a plate line. Due to the range of voltages a plate line may experience, transitioning between access operations (e.g., transitioning from a read operation to a write operation) may result in a voltage increase across the plate line, which may result in increased power consumption by the memory array. By coupling the plate line with a capacitor, a portion of a charge from an access operation may be reused. Thus, in subsequent access operations, the reused charge may be applied to the plate line (and potentially supplemented) to achieve the desired voltage across the plate line for performing various operations. Accordingly, such an operation may result in a reduced power consumption of the memory array.

In a first example, a capacitor may be coupled with a plate line and a voltage source. The plate line may be further coupled with a bank of ferroelectric memory cells. By activating and deactivating one or more switching components, the voltage source may charge the capacitor. The charge of the capacitor may be subsequently discharged onto the plate line by activating and deactivating one or more switching components. Discharging the capacitor onto the plate line may result in a first voltage across the plate line. In some examples, an access operation (e.g., a write operation) associated with one or more of the ferroelectric memory cells coupled with the plate line may be performed when the voltage across the plate line is greater than the first voltage (e.g., greater than the voltage resulting from discharging the capacitor). Accordingly, the voltage of the plate line may be increased to a second (e.g., a desired) voltage by activating a second one or more switching components coupled with the plate line and a voltage source. As a result, an access operation may be performed on one or more ferroelectric memory cells coupled with the plate line using less power than other methods, and a resulting charge may be stored at a capacitor of a respective memory cell for use in other operations.

In some examples, the charge described above (e.g., the charge stored at a capacitor of a respective memory cell) may be utilized in a subsequent access operation. For example, the capacitor may be discharged onto the plate line and stored (e.g., recycled) at the capacitor coupled with the plate line by activating a combination of the switching components described above. To conduct the access operation, the capacitor may be discharged onto the plate line and supplemented (e.g., increased to a second voltage) by the voltage source. By utilizing the stored (e.g., recycled) charge, the memory array may experience a reduction in power consumption for performing one or more access operations.

Features of the disclosure introduced above are further described below at an exemplary memory array in the context of FIG. 1. Specific examples of one or more circuits are then described in the context of FIGS. 2 through 6. These and other features of the disclosure are further illustrated by and described with reference to the device and system diagrams of FIGS. 7 and 8, which describe various components, as well as flowcharts of FIGS. 9 and 10 that relate to ferroelectric memory plate power reduction.

FIG. 1 illustrates an example memory array 100 in accordance with various examples of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting access line 110 and digit line 115. Access lines 110 may also be known as word lines 110, and bit lines 115 may also be known digit lines 115. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.)

According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105.

Memory array 100 may be a two-dimensional (2D) memory array or a three-dimensional (3D) memory array. A 3D memory array may include two-dimensional (2D) memory arrays formed on top of one another. This may increase the number of memory cells that may be placed or created on a single die or substrate as compared with 2D arrays, which in turn may reduce production costs or increase the performance of the memory array, or both. Memory array 100 may include any number of levels. Each level may be aligned or positioned so that memory cells 105 may be approximately aligned with one another across each level.

Each row of memory cells 105 may be connected to a single word line 110, and each column of memory cells 105 may be connected to a single digit line 115. In the example depicted in FIG. 1, memory array 100 includes one/two level/levels of memory cells 105 and may thus be considered a two-dimensional/three-dimensional memory array; however, the number of levels is not limited. By activating one word line 110 and one digit line 115 (e.g., applying a voltage to the word line 110 or digit line 115), a single memory cell 105 may be accessed at their intersection. Additionally, for example, in a 3D memory array, each level in a row may have common conductive lines such that each level may share word lines 110 or digit lines 115 or contain separate word lines 110 or digit lines 115. Thus in a 3D configuration one word line 110 and one digit line 115 of a same level may be activated to access a single memory cell 105 at their intersection. The intersection of a word line 110 and digit line 115, in either a 2D or 3D configuration, may be referred to as an address of a memory cell.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. Other lines (not shown in FIG. 1) may be present. For example, plate lines, described in more detail with reference to at least FIG. 2, may be coupled to the memory cell 105.

In some examples, a section of ferroelectric memory cells 105 (e.g., a section of memory array 100) may be coupled with a plate line. The plate line may be coupled with a capacitor and at least one voltage source such that a voltage may be applied to the plate line from the capacitor and the voltage source. As described below, the capacitor may be discharged onto the plate line to increase a voltage of the plate line to a first value, and voltage of the plate line may then further be increased—by the voltage source—to a second value (e.g., a second value higher than the first value). Thus by discharging at least a portion of the capacitor to the plate line before applying a voltage from the voltage source, memory array 100 may utilize less power in performing one or more operations.

Accessing memory cells 105 may be controlled through a row decoder 120, a column decoder 130 and, in some cases, a plate line decoder (not shown). For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. This process is discussed in more detail below. In some examples, a capacitor may be coupled with a plate line (e.g., plate line 210 as described with reference to FIG. 2), and may apply a first voltage to the plate line during an access operation. During an access operation, it may be desirable for a voltage of the plate line to reach a particular value (e.g., VDD). Discharging the capacitor onto the plate line may increase the voltage of the plate line to a value greater than 0V, but less than VDD. Subsequently, a second (e.g., additional) voltage may be applied to the plate line from a voltage source (e.g., from VDD) coupled with the plate line. As described above, by discharging the capacitor onto the plate line, a first voltage across the plate line may be greater than 0V but less than VDD. Thus the second voltage applied to the plate line (e.g., from a voltage source that may have a voltage of VDD) may act as a supplemental voltage and may increase the voltage across the plate line to the desired value (e.g., VDD). Accordingly, discharging the capacitor before applying the second voltage to the plate line may result in an overall power savings associated with the write-back operation.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures. Additionally or alternatively, by discharging a capacitor onto a plate line during a write-back operation, memory array 100 may experience reduced power consumption.

The memory controller 140 may control the operation (e.g., read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105. In general, the amplitude, shape, or duration of an applied voltage or current discussed herein may be adjusted or varied and may be different for the various operations discussed in operating memory array 100. Further, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

As discussed above, a capacitor may be discharged onto a plate line, resulting in a first voltage across the plate line that may be greater than 0V but less than VDD. Subsequently, a second voltage may be applied to the plate line (e.g., from a voltage source), and may act as a supplemental voltage to increase the voltage across the plate line to a desired value. Accordingly, memory controller 140 may carry out or be utilized in one or more related operations. For example, memory controller 140 may activate or deactivate one or more switching components to facilitate the capacitor being discharged onto the plate line, the application of a voltage (e.g., from VDD) to the plate line or both. In some examples, memory controller may initiate charging the capacitor. Memory controller 140 may initiate applying a first voltage (e.g., from a capacitor) to at least one of the plurality of ferroelectric memory cells by activating a first switching component coupled with the capacitor. In other examples, memory controller 140 may initiate applying a second voltage (e.g., from a voltage source) to the at least one of the plurality of ferroelectric memory cells by activating a second switching component coupled with the voltage source. As discussed above, applying voltages to the plate line from both the capacitor and from the voltage source may result in reduced power consumption by memory array 100.

Figure 2:
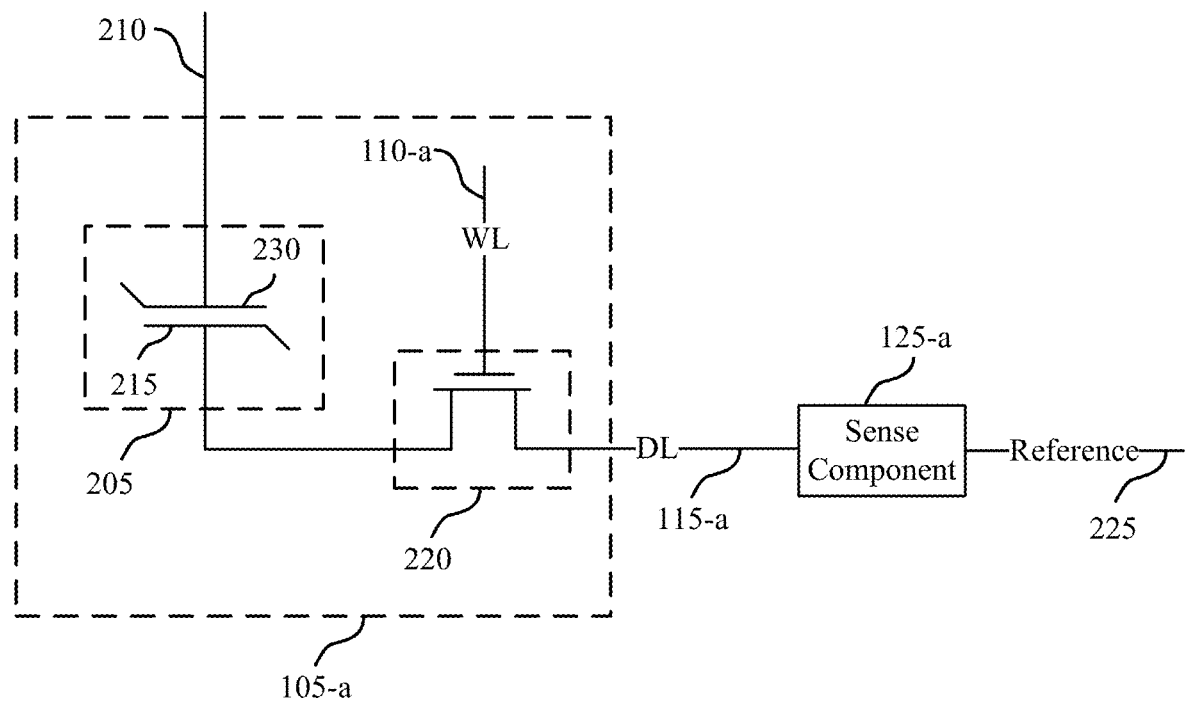
FIG. 2 illustrates an example circuit that supports ferroelectric memory plate power reduction in accordance with examples of the present disclosure.

FIG. 2 illustrates an example circuit 200 in accordance with various examples of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference line 225. Cell plate 230 may be accessed via plate line 210 and cell bottom 215 may be accessed via digit line 115-a. As described above, various states may be stored by charging or discharging capacitor 205. In some examples, memory cell 105-a may be an example of one ferroelectric memory cell of a section of ferroelectric memory cells. For example, a bank of memory cells (e.g., of a memory array) may include multiple sections, and each section may include multiple cells. Accordingly, in some examples, plate line 210 may be coupled with one or more sections of ferroelectric memory cells.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate the selection component 220; for example, a voltage applied to word line 110-a is applied to the transistor gate, connecting capacitor 205 with digit line 115-a.

In other examples, the positions of selection component 220 and capacitor 205 may be switched, such that selection component 220 is connected between plate line 210 and cell plate 230 and such that capacitor 205 is between digit line 115-a and the other terminal of selection component 220. In this example, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground, which may be referred to as "floating," prior to biasing plate line 210 and word line 110-a. Biasing plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205— e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving cell plate."

In some examples, a write-back operation may occur on one or more memory cells (e.g., memory cell 105-a). For example, as described above with reference to FIG. 1, during a write-back operation it may be desirable for a voltage of the plate line 210 to reach a particular value (e.g., VDD). Thus a capacitor coupled with the plate line 210 may be discharged, which may increase the voltage of the plate line 210 to a first voltage. In some examples, a second (e.g., additional) voltage may be applied to the plate line 210 from a voltage source (e.g., from VDD) coupled with the plate line to further-increase the voltage of the plate line 210. Accordingly, by utilizing both voltages (e.g., from the capacitor and voltage source), the plate line 210 may be increased to a desired value to carry out a write-back operation. Such an operation may result in an overall power savings of a memory array (e.g., memory array 100 as described with reference to FIG. 1).

The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage. In some cases, the sense amplifier may additionally drive digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-a has a lower voltage than reference line 225, the sense amplifier output may be driven to a negative or ground voltage. Sense component 125-a may similarly latch the sense amplifier output to determine the stored state in memory cell 105-a, e.g., logic 0. The latched logic state of memory cell 105-a may then be output, for example, through column decoder 130 as output 135 with reference to FIG. 1.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of cell plate 230 (through plate line 210) and cell bottom 215 (through digit line 115-a). To write a logic 0, cell plate 230 may be taken high, that is, a positive voltage may be applied to plate line 210, and cell bottom 215 may be taken low, e.g., virtually grounding or applying a negative voltage to digit line 115-a. The opposite process is performed to write a logic 1, where cell plate 230 is taken low and cell bottom 215 is taken high. As described above, in some examples, the voltage applied across capacitor 205 may originate from two sources. A capacitor may be discharged onto plate line 210 to increase the voltage of the plate line 210 to a first voltage. In some examples, a second voltage (e.g., from a voltage source) may increase the voltage of the plate line 210 to a second voltage, which may be the voltage applied across capacitor 205. As described above, the voltage may be applied across capacitor 205 by controlling the voltage of cell plate 230 (through plate line 210) and cell bottom 215 (through digit line 115-*a*).

Figure 3A:
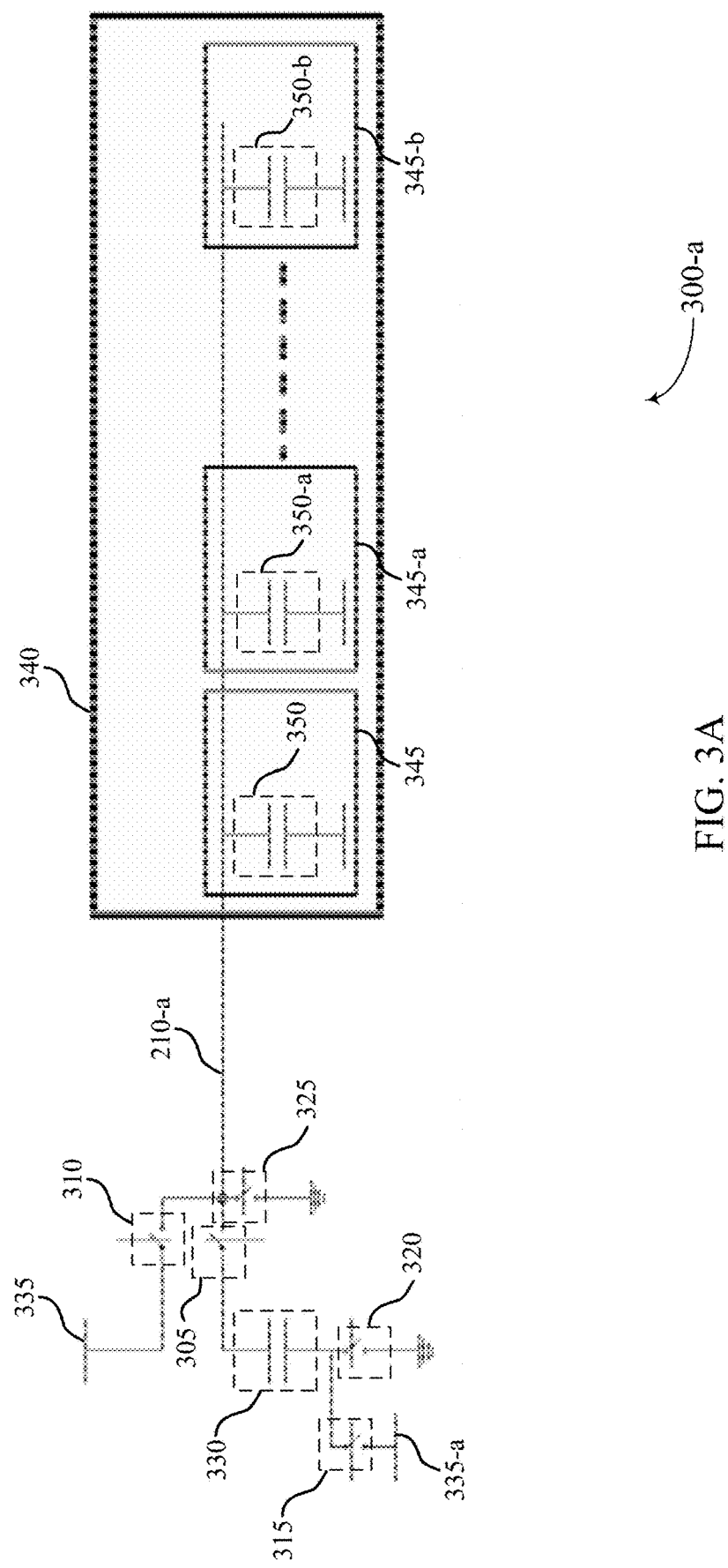
FIGS. 3A and 3B illustrate an example circuit and timing diagram that support ferroelectric memory plate power reduction in accordance with examples of the present disclosure.

FIG. 3A illustrates an example circuit 300-*a* in accordance with various examples of the present disclosure. Circuit 300-*a* includes a section 340 of a memory bank (e.g., a bank of memory array 100 as described with reference to FIG. 1). Section 340 may include patches 345, 345-*a*, and 345-*b*, which may each include one or more memory cells (e.g., memory cell 105-*a* as described with reference to FIG. 2). For example, each of patches 345, 345-*a*, and 345-*b* may include one ferroelectric memory cell having ferroelectric capacitors 350, 350-*a*, and 350-*b* (e.g., second capacitor 350, 350-*a*, 350-*b*), respectively. In some examples, section 340 may be coupled with plate line 210-*a*, which may be an example of plate line 210 as described with reference to FIG. 2. Plate line 210-*a* may be coupled with a capacitor 330 (e.g., first capacitor 330), voltage source 335, and voltage source 335-*a*. Each of capacitor 330, voltage source 335, and 335-*a* may be coupled with one or more of a first switching component 305, a second switching component 310, a third switching component 315, a fourth switching component 320, and/or a fifth switching component 325.

In some examples, capacitor 330, voltage source 335, and 335-*a* may be utilized to conduct an access operation (e.g., a write operation, a write-back operation) relative to one or more memory cells of patches 345, 345-*a*, and 350-*b*. In some examples, a write operation may begin with an initial charge applied to capacitor 330 (e.g., begin with a capacitor having an initial charge from a previous access operation). An initial charge may be applied to capacitor 330 based on an intrinsic capacitance of section 340. To apply the initial charge to capacitor 330, one or more switching components (e.g., switching components 305, 310, 315, 320, and 325) may be activated and/or deactivated. For example, first switching component 305 and fourth switching component 320 may be activated, and third switching component 315 may be deactivated. By activating first switching component 305 and fourth switching component 320 and deactivating third switching component 315, an initial charge may be applied to capacitor 330 based on an intrinsic capacitance of section 340, resulting in a voltage being applied to plate line 210-*a*.

After charging capacitor 330 (e.g., based on an intrinsic capacitance of section 340), a voltage of the plate line 210-*a* may be increased (e.g., to a first voltage) by activating the third switching component 315 and deactivating the fourth switching component 320. Accordingly, a voltage may be applied to plate line 210-*a* from capacitor 330. In some examples, the voltage applied to plate line 210-*a* from capacitor 330 may be less than a voltage for performing an access operation. For example, the voltage needed to conduct a write operation may depend on the logic state being written to the memory cell. Stated another way, the voltage of plate line 210-*a* may be higher to write a logic "1" than to write a logic "0" to the memory cell. For example, to write a logic "1" to a memory cell associated with ferroelectric capacitor 350, the plate line may need to reach voltage VDD. Although voltage VDD may have been applied to capacitor 330 from voltage source 335-*a*, the voltage applied to plate line 210-*a* from capacitor 330 may be less than VDD due to certain properties of the circuit components, such as the capacitor (e.g., leakage). Thus, it may be desirable to apply an additional voltage to plate line 210-*a* to increase the voltage applied to the plate line 210-*a* to VDD.

To apply an additional voltage to plate line 210-*a*, first switching component 305 may be deactivated and second switching component may be activated (e.g., while fifth switching component 325 remains deactivated). The additional voltage may be applied to the plate line 210-*a* from voltage source 335, which may be a same voltage source as voltage source 335-*a*. Accordingly, the voltage source 335 may apply an additional voltage to the plate line 210-*a*, which may increase the voltage of the plate line 210-*a* to VDD. Thus, in some examples, the additional voltage may be or may be referred to as a supplemental voltage (e.g., to increase the voltage of the plate line 210-*a* to a desired voltage). By increasing the plate line 210-*a* to VDD, a write operation may be conducted on one or more memory cells of section 340. For example, a write operation may occur on a memory cell associated with patch 345 and having ferroelectric capacitor 350. Thus, a charge associated with the voltage of the plate line 210-*a* may be stored at ferroelectric capacitor 350 during a write operation.

In some examples, a write-back operation may occur after the write operation described above. For example, during the write operation described above, at least some of the charge associated with the voltage of the plate line 210-*a* may be stored at ferroelectric capacitor 350. The charge may be or may be associated with a parasitic capacitance of plate line 210-*a*. Thus capacitor 350 (and capacitors 350-*a* and 350-*b*) may be sized in accordance with a parasitic capacitance of the plate line 210-*a*.

To begin a write-back operation, capacitor 350 may be discharged onto plate line 210-*a*, resulting in a voltage across plate line 210-*a*. In some examples, the voltage applied to the plate line 210-*a* from the capacitor 350 may be less than the voltage applied to the capacitor 350 due to the properties of capacitor 350 (e.g., leakage). After discharging capacitor 350, a resulting charge (e.g., a second charge) may be store at capacitor 330 by deactivating second switching component 310 and activating first switching component 305. In some examples, third switching component 315 and fifth switching component 325 may remain deactivated. In other examples fourth switching component 320 may be activated to connect the capacitor 330 (e.g. the back side of capacitor 330) to ground (e.g., 0V). Grounding the back side of capacitor 330 may improve the charging operation of capacitor 330.

After charging capacitor 330 a write-back operation may occur on a ferroelectric memory cell associated with one or more of patches 345, 345-*a*, and 345-*b*. For example, the write-back operation may occur on a ferroelectric memory cell associated with ferroelectric capacitor 350-*a* of patch 345-*a*. To begin the write-back operation, capacitor 330 may be discharged onto plate line 210-*a*. This may be referred to as applying a first voltage to plate line 210-*a*. To discharge capacitor 330 onto plate line, first switching component 305 may be activated, and second switching component 310 and fifth switching component 325 may be deactivated. Accordingly, a first voltage may be applied to plate line 210-*a* from capacitor 330. In some examples, the first voltage may be less than a voltage needed to conduct a write-back operation. As described above with respect to a write operation, the voltage needed to conduct a write-back operation may depend on the logic state being written to the memory cell. For example, during an example write-back operation, it may be desirable for a voltage across the plate line 210-*a* to reach voltage level VDD. Because the first voltage applied to the plate line 210-*a* may be less than VDD (e.g., due to leakage of capacitor 330) it may be desirable to apply a second voltage to plate line 210-*a* to increase the voltage to VDD.

To apply a second voltage to plate line 210-*a*, first switching component 305 may be deactivated and second switching component 310 may be activated (e.g., while fifth switching component 325 remains deactivated). The second voltage may be applied to the plate line 210-*a* from voltage source 335. Accordingly, the voltage source 335 may apply a second voltage to the plate line 210-*a* to increase the voltage of the plate line 210-*a* to VDD. By increasing the plate line 210-*a* to VDD, a write-back operation may be conducted on one or more memory cells of section 340. By utilizing both capacitor 330 and voltage source 335, both the write operation and the write back operation may consume less power (e.g., than other write or write-back operations).

In some examples, each patch (e.g., patch 345, 345-*a*, 345-*b*) may include a plurality of ferroelectric memory cells. A write or write-back operation may occur on any combination of ferroelectric memory cells of a same patch concurrently, or on any combination of ferroelectric memory cells of different patches concurrently. For example, according to the methods described above, capacitor 330 may be discharged onto plate line 210-*a* and voltage source 335 may increase the voltage of plate line 210-*a* to VDD. The resulting voltage (e.g., a second voltage) may be applied to any one or combination of ferroelectric memory cells of patches 345, 345-*a*, and 345-*b*. As described above, such operations may consume less power than other write or write-back operations.

Figure 3B:
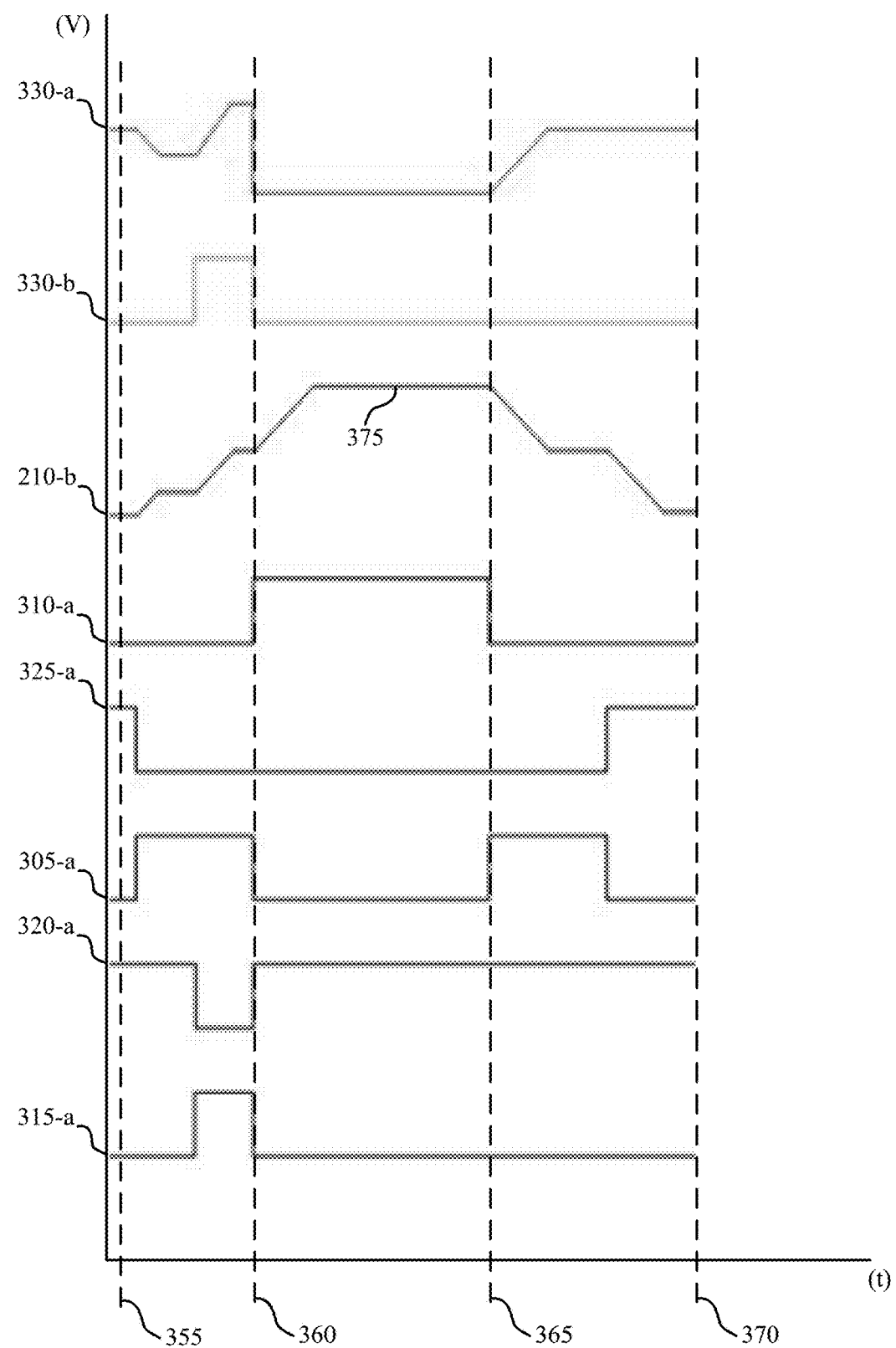

FIG. 3B illustrates an example timing diagram 300-*b* in accordance with various examples of the present disclosure. In some examples, timing diagram 300-*b* may illustrate one or more operations of circuit 300-*a* as described with respect to FIG. 3A. Timing diagram 300-*b* may illustrate one or more operations of plate line 210-*b*, which may be an example of plate line 210-*a* as described with reference to FIG. 3A; first switching component 305-*a*, which may be an example of first switching component 305 as described with reference to FIG. 3A; second switching component 310-*a*, which may be an example of second switching component 310 as described with reference to FIG. 3A; third switching component 315-*a*, which may be an example of third switching component 315 as described with reference to FIG. 3A; fourth switching component 320-*a*, which may be an example of fourth switching component 320 as described with reference to FIG. 3A; and fifth switching component 325-*a*, which may be an example of fifth switching component 325 as described with reference to FIG. 3A. In some examples, timing diagram 300-*b* may illustrate one or more operations of a capacitor (e.g., front side of capacitor 330-*a* and back side of capacitor 330-*b*), which may be an example of capacitor 330 as described with reference to FIG. 3A. In some examples, the following operations may be performed wholly or partially by a memory controller (e.g., memory controller 140 as described with reference to FIG. 1).

At time 355, a first command may be issued (e.g., to circuit 300-*a* as described with reference to FIG. 3). In some examples, the first command may be referred to as a precharge command. Upon receiving a first command, a capacitor (e.g., capacitor 330-*a*, 330-*b*) may be charged from a previous access operation. For example, the first command (e.g., at least one command, multiple commands) may be transmitted to first switching component 305-*a* and the fourth switching component 320-*a* to activate the switching components. In some examples, the first command may be transmitted to the second switching component 310-*a*, the third switching component 315-*a*, and the fifth switching component 325-*a* to deactivate the switching components. In some examples, the first command may be transmitted to the third switching component 315-*a* and the fourth switching component 320-*a* based on (e.g., after) the onset of the first interval 355. By transmitting the first command to the third switching component 315-*a* and the fourth switching component 320-*a* based on the onset of the first interval 355, the overall power consumption of the memory array (e.g., a memory array 100 as described with reference to FIG. 1) may be reduced. Accordingly, a voltage may be applied to the back side of the capacitor 330-*b* (e.g., from voltage source 335-*a* as described with reference to FIG. 3A). In some examples, the voltage of plate line 210-*b* may increase based in part on the capacitor being charged (e.g., due to the capacitor being discharged by time 360).

At time 360, the capacitor may be discharged onto the plate line 210-*b*. Upon completion of discharging the capacitor, a command (e.g., a second command, multiple commands) may be issued and transmitted to various switching components. For example, a second command may result in the first switching component 305-*a* and the third switching component 315-*a* being deactivated. Additionally or alternatively, the second command may result in the second switching component 310-*a* and the fourth switching component 320-*a* being activated. In some examples, the fifth switching component 325-*a* may remain in a deactivated state. Accordingly, the charge of the capacitor may be discharged onto plate line 210-*b*.

As described above, during an access operation, it may be desirable for a voltage across the plate line (e.g., plate line 210-*b*) to reach voltage level VDD to perform or enable one or more access operations. Because the voltage applied to the plate line 210-*b* based on discharging the capacitor may be less than VDD, it may be desirable to apply a second voltage to plate line 210-*b* to increase the voltage to at least VDD. Accordingly, by deactivating the first switching component 305-*a* and the third switching component 315-*a*, and activating the second switching component 310-*a* and the fourth switching component 320-*a*, a second voltage may be applied to plate line 210-*b* (e.g., from voltage source 335 as described with reference to FIG. 3A). Accordingly, a voltage across plate line 210-*b* may reach voltage level VDD 375.

At time 365, a charge resulting from the voltage across plate line 210-*b* (e.g., voltage level VDD) may be stored a capacitor of one or more memory cells (e.g., of section 340 as described with reference to FIG. 3A). Accordingly the voltage across plate line 210-*b* may decrease. In some examples, at time 365, a third command (e.g., at least one command, multiple commands) may be transmitted to deactivate second switching component 310-*a* and activate first switching component 305-*a*. In some examples, the third switching component 315-*a* and fifth switching component 325-*a* may remain deactivated. By deactivating second switching component 310-*a* and activating first switching component 305-*a*, no voltage may be applied to the plate line 210-*b* from the voltage source (e.g., voltage source 335 as described with reference to FIG. 3A). In some examples, after activating the first switching component 305-*a* an intrinsic capacitance of the section 340 may be shared with capacitor 330 through the connection based on activating the first switching component 305-*a*, and thus capacitor 330 may be charged. Subsequently, the first switching component 305-*a* may be deactivated and the fifth switching component 325-*a* may be activated, which may result in the plate line 210-b being grounded. In some examples, time 370 may signify the end of the access operation described above.

Figure 4:
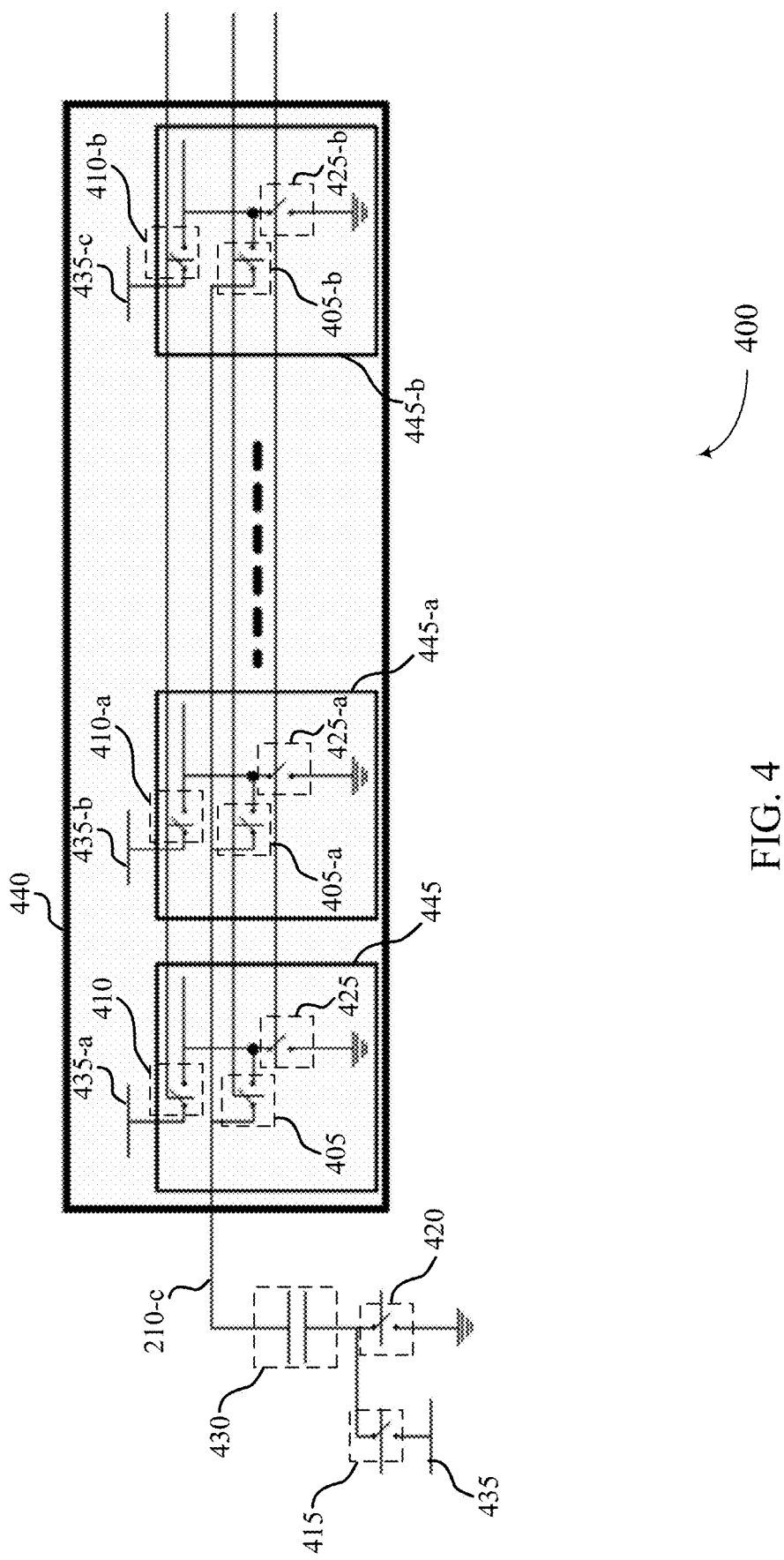
FIGS. 4 through 6 illustrate example circuits that support ferroelectric memory plate power reduction in accordance with examples of the present disclosure.

FIG. 4 illustrates an example circuit 400 in accordance with various examples of the present disclosure. Circuit 400 may be an alternative configuration (e.g., as compared to circuit 300 as described with reference to FIG. 3A) and may include a section 440 of a memory bank (e.g., a bank of memory array 100 as described with reference to FIG. 1). Section 440 may include patches 445, 445-a, and 445-b, which may each include one or more memory cells (e.g., memory cell 105-a as described with reference to FIG. 2). For example, each of patches 445, 445-a, and 445-b may include one ferroelectric memory cell having a respective ferroelectric capacitor (not shown). In some examples, section 440 may be coupled with plate line 210-c, which may be an example of plate line 210-a as described with reference to FIG. 3A. In some examples, plate line 210-c may be coupled with a capacitor 430 and voltage source 435. Each of capacitor 430 and voltage source 435 may be coupled with one or more of a first switching component of each patch (e.g., first switching component 405, 405-a, 405-b), a second switching component of each patch (e.g., second switching component 410, 410-a, and 410-b), and a fifth switching component of each patch (e.g., fifth switching component 425, 425-a, 425-b).

In some examples, capacitor 430 and voltage source 435 may be utilized to conduct an access operation (e.g., a write operation, a write-back operation) relative to one or more memory cells of patches 445, 445-a, and 445-b. In some examples, a write operation may begin with an initial charge applied to capacitor 430 (e.g., from a previous access operation) by activating or deactivating a combination of switching components. For example, a first switching component of each patch (e.g., 405, 405-a, 405-b) and fourth switching component 420 may be activated, and third switching component 415 may be deactivated. By deactivating a first switching component of each patch and fourth switching component 420, and activating third switching component 415, an initial charge may be applied to capacitor 430 based on an intrinsic capacitance of section 440, resulting in a voltage being applied to plate line 210-c.

After charging capacitor 430, capacitor 430 may be discharged onto plate line 210-c. To discharge capacitor 430, a first switching component of a desired patch may be activated and a second switching component of the same patch may be deactivated. Stated another way, if writing to a ferroelectric memory cell associated with patch 445, first switching component 405 may be activated and second switching component 410 may be deactivated. Additionally or alternatively, fifth switching component 425 of patch 445 may be deactivated. Accordingly, a voltage may be applied to plate line 210-c from capacitor 430. Because the voltage may be less than a voltage needed to conduct a write operation, as described above, it may be desirable to apply an additional voltage to plate line 210-c to increase the voltage to VDD.

To apply an additional voltage to the plate line of patch 445, a first switching component of the desired patch (e.g., first switching component 405 of patch 445) may be deactivated and a second switching component of the same patch (e.g., second switching component 410 of patch 445) may be activated (e.g., while fifth switching component 425 remains deactivated). The additional voltage may be applied to the plate line of patch 445 from voltage source 435-a. Accordingly, the voltage source 435-a may apply an additional voltage to the plate line, which may increase the voltage of the plate line to VDD. By increasing the plate line to VDD, a write operation may be conducted on one or more memory cells of patch 445.

In some examples, a second access operation (e.g., a write-back operation) may occur after a first access operation (e.g., a write operation described above). To begin a write-back operation, a capacitor associated with one or more memory cells of one or more patches (e.g., patch 445, 445-a, 445-b) may be discharged onto plate line 210-c resulting in a voltage across plate line 210-c. After discharging the capacitor, the resulting voltage of plate line 210-c may be applied to capacitor 430 by deactivating a second switching component of the patch (e.g., second switching component 410 of patch 445) and activating a first switching component of the same patch (e.g., first switching component 405 of patch 445).

After charging capacitor 430 (e.g., based on an intrinsic capacitance of section 440), a voltage of the plate line 210-c may be increased (e.g., to a first voltage value) by activating the third switching component 415 and deactivating the fourth switching component 420. Accordingly, a first voltage may be applied to plate line 210-c from capacitor 430. In some examples, the first voltage may be less than a voltage needed to conduct a write-back operation. Thus it may be desirable to apply a second voltage to plate line 210-c to increase the voltage to VDD.

To apply a second voltage to plate line of patch 445-a, first switching component of patch 445-a (e.g., first switching component 405-a) may be deactivated and second switching component 410-a may be activated (e.g., while fifth switching component 425-a remains deactivated). The second voltage may be applied to the plate line of patch 445 from voltage source 435-b. Accordingly, the voltage source 435-b may apply a second voltage to the plate line 210-c to increase the voltage of the plate line to VDD. In some examples, each of voltage sources 435, 435-a, 435-b, and 435-c may be a same voltage source. By increasing the plate line of each patch to VDD, a write-back operation may be conducted on one or more memory cells of patch 445-a. As described above, by utilizing both capacitor 430 and voltage source of a particular patch (e.g., voltage source 435-a, 435-b, 435-c), both the write operation and the write back operation may consume less power (e.g., than other write or write-back operations).

In some examples, each patch (e.g., patch 445, 445-a, 445-b) may include a plurality of ferroelectric memory cells. A write or write-back operation may occur on any combination of ferroelectric memory cells of a same section concurrently, or on any combination of ferroelectric memory cells of different sections concurrently. For example, according to the methods described above, capacitor 430 may be discharged onto plate line 210-c and one or more of voltage sources 435-a, 435-b, and 435-c may increase the voltage of the patch plate line to VDD. The resulting voltage (e.g., a second voltage) may be applied to any one or combination of ferroelectric memory cells of patches 445, 445-a, and 445-b. As described above, such operations may consume less power than other write or write-back operations.

Figure 5:
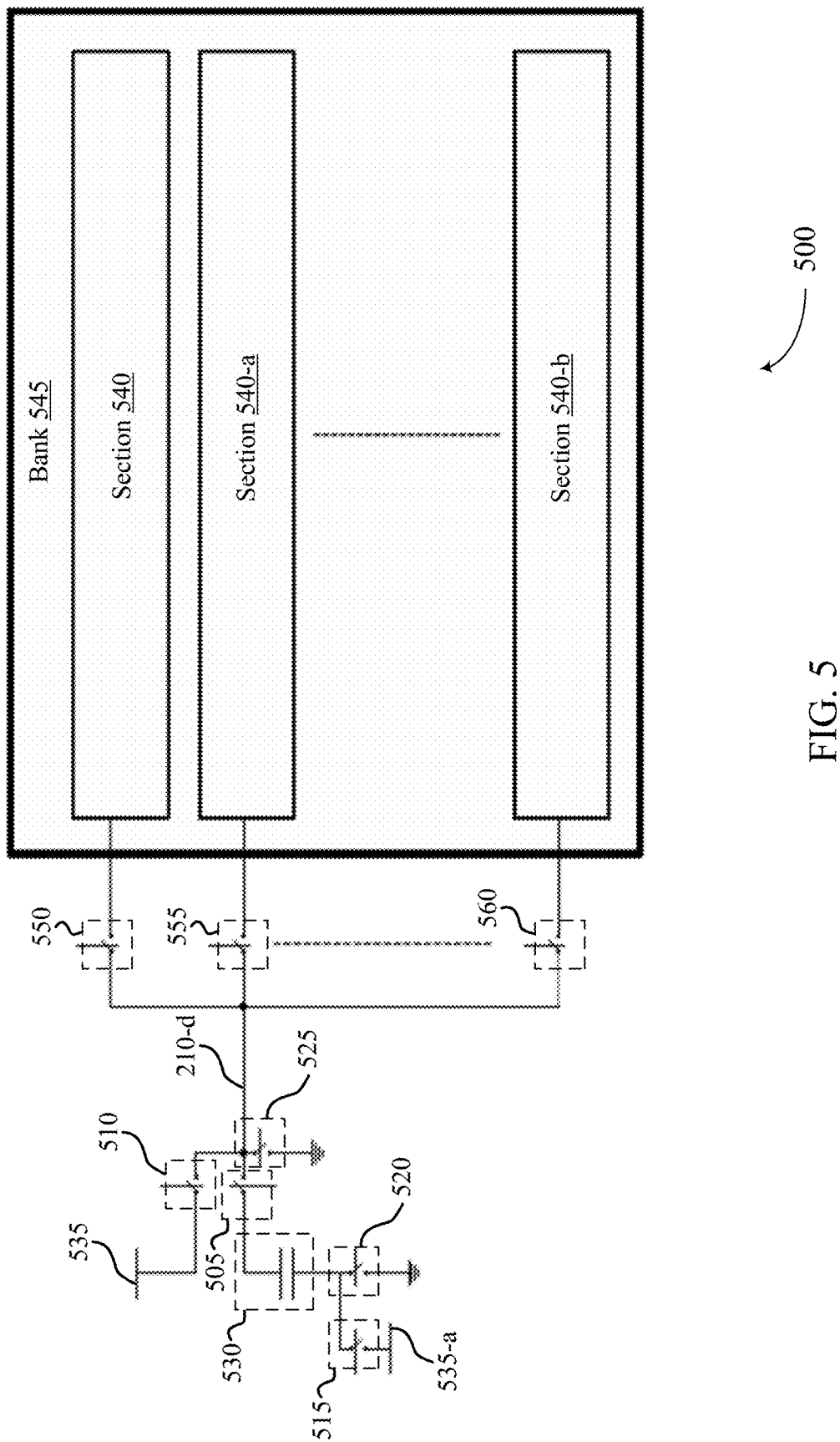

FIG. 5 illustrates an example circuit 500 in accordance with various examples of the present disclosure. Circuit 500 may be an alternative configuration (e.g., as compared to circuit 300 as described with reference to FIG. 3A) and may include a bank 545 (e.g., a bank of sections of ferroelectric memory cells), that includes sections 540, 540-a, and 540-b (e.g., sections of ferroelectric memory cells). Each of sections 540-, 540-a, and 540-b may include one or more patches (not shown), that each include one or more memory cells (e.g., memory cell 105-a as described with reference to FIG. 2). For example, each of sections 540, 540-a, and 540-b may include one ferroelectric memory cell having a ferroelectric capacitor. In some examples, section 540 may be coupled with plate line 210-d via switching component 550, section 540-a may be coupled with plate line 210-d via switching component 555, and section 540-b may be coupled with plate line 210-d via switching component 560. Plate line 210-d may be coupled with a capacitor 530, voltage source 535, and voltage source 535-a. Each of capacitor 530, voltage source 535, and 535-a may be coupled with one or more of a first switching component 505, a second switching component 510, a third switching component 515, a fourth switching component 520, a fifth switching component 525, a sixth switching component 550, a seventh switching component 555, and an eighth switching component 560.

In some examples, capacitor 530, voltage source 535, and 535-a may be utilized to conduct one or more access operations (e.g., a write operation, a write-back operation) relative to one or more memory cells of sections 540, 540-a, and 540-b. In some examples, a write operation may begin with capacitor 530 being discharged onto plate line 210-d by activating or deactivating a combination of switching components. For example, first switching component 505 and fourth switching component 520 may be activated, and third switching component 515 may be deactivated. By activating first switching component 505 and fourth switching component 520, and deactivating third switching component 515, a voltage may be applied to capacitor 530 (e.g., to back side of capacitor 530) from voltage source 535-a (e.g., from VDD). This may charge capacitor 530 to a desired value (e.g., until capacitor 530 reaches a charged state).

To apply a first voltage to plate line 210-d, and second switching component 510 and fifth switching component 525 may be deactivated. Additionally or alternatively, one or more of sixth switching component 550, seventh switching component 555, and eighth switching component 560 (e.g., depending on a memory cell being written to) may be activated. Accordingly, a voltage may be applied to plate line 210-d from capacitor 530. Because the voltage may be less than a voltage needed to conduct a write operation, as described above, it may be desirable to apply an additional voltage to plate line 210-d to increase the voltage to VDD.

To apply an additional voltage to plate line 210-d, first switching component 505 may be deactivated and second switching component may be activated (e.g., while fifth switching component 525 remains deactivated). The additional voltage may be applied to the plate line 210-d from voltage source 535. Accordingly, the voltage source 535 may apply an additional voltage to the plate line 210-d, which may increase the voltage of the plate line 210-d to VDD. By increasing the plate line 210-d to VDD, a write operation may be conducted on one or more memory cells of one of sections 540, 540-a, or 540-b. For example, to write to a memory cell associated with section 540, sixth switching component 550 may be activated and seventh switching components 555 and eighth switching component 560 may be deactivated. In other examples, any combination of sixth switching component 550, seventh switching component 555, and eighth switching component 560 may be activated and/or deactivated. Depending on the memory cell being written to, a charge associated with the voltage of the plate line 210-d may be stored at a ferroelectric capacitor associated with the memory cell(s) of a respective section or sections.

In some examples, a second access operation (e.g., a write-back operation) may occur after a first access operation (e.g., a write operation described above). To begin a write-back operation, a capacitor associated with one or more memory cells of one or more sections (e.g., sections 540, 540-a, 540-b) may be discharged onto plate line 210-d resulting in a voltage across plate line 210-d. The capacitor may be discharged by activating one or more of sixth switching component 550, seventh switching component 555, and eighth switching component 560. After discharging the capacitor, the resulting voltage of plate line 210-d may be applied to capacitor 530 by deactivating second switching component 510 and activating first switching component 505 and fourth switching component 520.

After charging capacitor 530 a write-back operation may occur on a ferroelectric memory cell associated with one or more of sections 540, 540-a, and 540-b. For example, the write-back operation may occur on a ferroelectric memory cell associated with a ferroelectric memory cell of section 540-a. To begin the write-back operation, capacitor 530 may be discharged onto plate line 210-d. This may be referred to as applying a first voltage to plate line 210-d. To discharge capacitor 530 onto plate line, first switching component 505 may be activated, and second switching component 510 and fifth switching component 525 may be deactivated. Additionally or alternatively, seventh switching component 555 may be activated and sixth switching components 550 and eighth switching component 560 may be deactivated. Accordingly, a first voltage may be applied to plate line 210-d from capacitor 530. In some examples, the first voltage may be less than a voltage needed to conduct a write-back operation. Thus it may be desirable to apply a second voltage to plate line 210-d to increase the voltage to VDD.

To apply a second voltage to plate line 210-d, first switching component 505 may be deactivated and second switching component may be activated (e.g., while fifth switching component 525 remains deactivated). The second voltage may be applied to the plate line 210-d from voltage source 535. Accordingly, the voltage source 535 may apply a second voltage to the plate line 210-d to increase the voltage of the plate line 210-d to VDD. By increasing the plate line 210-d to VDD, a write-back operation may be conducted on one or more memory cells of section 540-a. As described above, by utilizing both capacitor 530 and voltage source 535, both the write operation and the write back operation may consume less power (e.g., than other write or write-back operations).

In other examples, each section (e.g., section 540, 540-a, 540-b) may include a plurality of ferroelectric memory cells. A write or write-back operation may occur on any combination of ferroelectric memory cells of a same section concurrently, or on any combination of ferroelectric memory cells of different sections concurrently. For example, according to the methods described above, capacitor 530 may be discharged onto plate line 210-d and voltage source 535 may increase the voltage of plate line 210-d to VDD. The resulting voltage (e.g., a second voltage) may be applied to any one or combination of ferroelectric memory cells of sections 540, 540-a, and 540-b. As described above, such operations may consume less power than other write or write-back operations.

Figure 6:
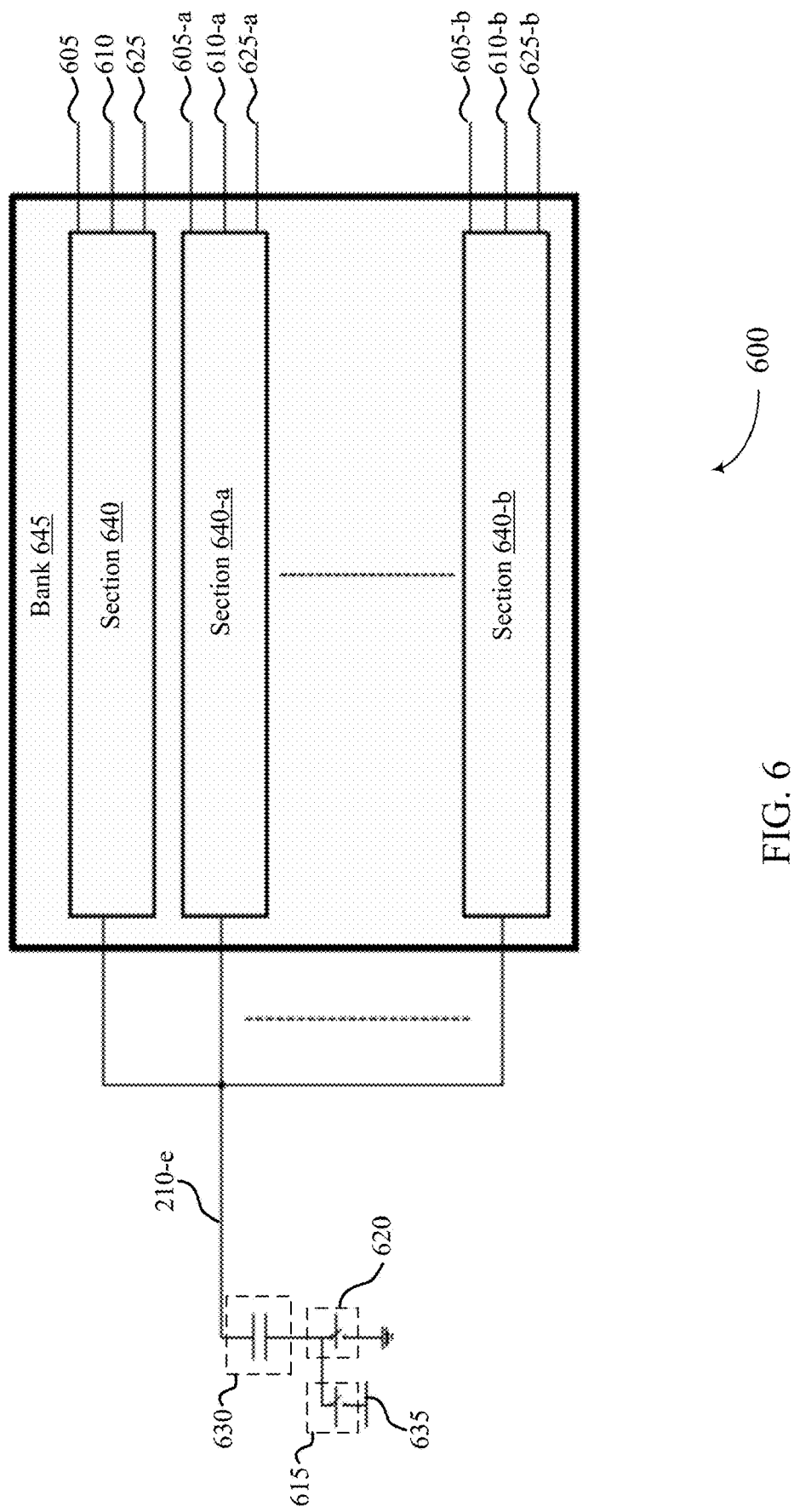

FIG. 6 illustrates an example circuit 600 in accordance with various examples of the present disclosure. Circuit 600 may be an alternative configuration (e.g., as compared to circuit 300 as described with reference to FIG. 3A) and may include a bank 645 (e.g., a bank of sections of ferroelectric memory cells), that includes sections 640, 640-*a*, and 640-*b* (e.g., sections of ferroelectric memory cells). Each of sections 640, 640-*a*, and 640-*b* may be an example of section 440 as described with reference to FIG. 4. Additionally or alternatively, each of sections 640, 640-*a*, and 640-*b* may include one or more patches (e.g., patch 445 as described with reference to FIG. 4) that each include one or more memory cells (e.g., memory cell 105-*a* as described with reference to FIG. 2). For example, each of sections 640, 640-*a*, and 640-*b* may include one ferroelectric memory cell having a ferroelectric capacitor. In some examples, each of sections 640, 640-*a*, and 640-*b* may be coupled with plate line 210-*e*. In some examples, plate line 210-*e* may be coupled with a capacitor 630 and voltage source 635. Each of capacitor 630 and voltage source 635 may be coupled with one or more of a first control line of each section (e.g., first control lines 605, 605-*a*, 605-*b*), a second control line of each section (e.g., second control line 610, 610-*a*, and 610-*b*), and a third control line of each section (e.g., third control line 625, 625-*a*, 625-*b*). In other examples (not shown), each of sections 640, 640-*a*, and 640-*b* may be coupled with plate line 210-*e* via one or more switching components (e.g., switching components 405, 410, and 420 as described with reference to FIG. 4).

In some examples, capacitor 630 and voltage source 635 may be utilized to conduct one or more access operations (e.g., a write operation, a write-back operation) relative to one or more memory cells of sections 640, 640-*a*, and 640-*b*. In some examples, a write operation may begin with an initial charge applied to capacitor 630 (e.g., from a previous access operation) by activating or deactivating a combination of switching components. For example, a first switching component of each section (e.g., first switching component 405 as described with reference to FIG. 4, a switching component that may be associated with or within a section) may be activated (e.g., via second control line 610). Additionally or alternatively, a fourth switching component 620 may be activated, and third switching component 615 may be deactivated. By activating a first switching component of each section and fourth switching component 620, and deactivating third switching component 615, an initial charge may be applied to capacitor 630 based on an intrinsic capacitance of section 640, resulting in a voltage being applied to plate line 210-*e*.

After charging capacitor 630, capacitor 630 may be discharged onto plate line 210-*e*. To discharge capacitor 630, a first switching component of a desired section may be activated (e.g., via second control line 610) and a second switching component (e.g., second switching component 410 as described with reference to FIG. 4, a switching component that may be associated with or within a section) of the same section may be deactivated (e.g., via first control lines 605). Stated another way, if writing to a ferroelectric memory cell associated with section 640, first switching component may be activated and second switching component may be deactivated. Additionally or alternatively, fifth switching component (e.g., fifth switching component 425, 425-*a*, 425-*b* as described with reference to FIG. 4, a switching component that may be associated with or within a section) of section 640 may be deactivated (e.g., via third control line 625). Accordingly, a voltage may be applied to plate line 210-*e* from capacitor 630. Because the voltage may be less than a voltage needed to conduct a write operation, as described above, it may be desirable to apply an additional voltage to the plate line of patch 445 to increase the voltage to VDD.

To apply an additional voltage to the plate line of patch 445, a first switching component of the desired section may be deactivated and a second switching component of the same section may be activated (e.g., while fifth switching component remains deactivated). The additional voltage may be applied to the plate line of patch 445 from a respective voltage source coupled with each section (not shown). In other examples, one voltage source may be coupled with multiple sections. Accordingly, the voltage source may apply an additional voltage to the plate line of patch 445, which may increase the voltage of the plate line of patch 445 to VDD. By increasing the plate line of patch 445 to VDD, a write operation may be conducted on one or more memory cells of section 640.

In some examples, a second access operation (e.g., a write-back operation) may occur after a first access operation (e.g., a write operation described above). To begin a write-back operation, a capacitor associated with one or more memory cells of one or more sections (e.g., section 640, 640-*a*, 640-*b*) may be discharged onto plate line 210-*e* resulting in a voltage across plate line 210-*e*. After discharging the capacitor, the resulting voltage of plate line 210-*e* may be applied to capacitor 630 by deactivating a second switching component of the section (e.g., via first control line 605) and activating a first switching component of the same section (e.g., via second control line 610).

After charging capacitor 630 (e.g., based on an intrinsic capacitance of section 440), a voltage of the plate line 210-*e* may be increased (e.g., to a first voltage value) by activating the third switching component 615 and deactivating the fourth switching component 620. Accordingly, a first voltage may be applied to plate line 210-*e* from capacitor 630. In some examples, the first voltage may be less than a voltage needed to conduct a write-back operation. Thus it may be desirable to apply a second voltage to the plate line of patch 445 to increase the voltage to VDD.

To apply a second voltage to the plate line of patch 445, first switching component of section 640-*a* may be deactivated (e.g., via second control line 610-*a*) and second switching component may be activated (e.g., via first control line 605-*a*). The second voltage may be applied to the plate line of patch 445 from a voltage source coupled with section 640-*a* (not shown). As described above, the voltage source may be associated with one or more of sections 640, 640-*a*, and 640-*b*. Accordingly, the voltage source may apply a second voltage to the plate line of patch 445, 445-*a*, and 445-*b* to increase the voltage of the plate line of each patch to VDD. By increasing the plate line of each patch to VDD, a write-back operation may be conducted on one or more memory cells of section 640-*a*. As described above, by utilizing both capacitor 630 and voltage source of a particular section or sections, both the write operation and the write back operation may consume less power (e.g., than other write or write-back operations).

In some examples, each section (e.g., sections 640, 640-*a*, 640-*b*) may include a plurality of ferroelectric memory cells. A write or write-back operation may occur on any combination of ferroelectric memory cells of a same section concurrently, or on any combination of ferroelectric memory cells of different sections concurrently. For example, according to the methods described above, capacitor 630 may be discharged onto plate line 210-*e* and one or more voltage sources may increase the voltage of plate line 210-*e* to VDD. The resulting voltage (e.g., a second voltage) may be applied to any one or combination of ferroelectric memory cells of sections 640, 640-a, 640-b. As described above, such operations may consume less power than other write or write-back operations.

In some examples FIGS. 3A through 6, as described above, may be an example of a ferroelectric memory cell coupled with a plate line. A first capacitor may be coupled with the ferroelectric memory cell through the plate line and a first switching component. In some examples, the first capacitor may be configured to apply a first voltage to the ferroelectric memory cell through the plate line when the first switching component is activated. Additionally or alternatively, a voltage source may be coupled with the plate line through a second switching component, In some examples, the voltage source may be configured to apply a second voltage to the plate line when the second switching component is activated.

In some examples, as described above, the voltage source may be coupled with the first capacitor through a third switching component. In some examples, the voltage source may be configured to charge the first capacitor when the third capacitor is activated. In other examples, a fourth switching component may be coupled with the first capacitor. In some examples, the voltage source may be configured to charge the first capacitor when the fourth switching component is deactivated. Additionally or alternatively, the first switching component may be coupled with a first side of the first capacitor, and the third switching component and the fourth switching component may be coupled with a second side of the first capacitor.

In some examples, a fifth switching component may be coupled with the plate line. The voltage source may be configured to apply the second voltage to the plate line when the fifth switching component is deactivated. In some examples, the ground voltage source may be configured to discharge the plate line when the fifth switching component is activated. In other examples, a second ferroelectric memory cell may be coupled with the plate line. The first capacitor may be coupled with the second ferroelectric memory cell through the plate line and a sixth switching component associated with the second ferroelectric memory cell, In some examples, the first switching component may be associated with the ferroelectric memory cell.

Additionally or alternatively, the voltage source may be configured to apply the second voltage to the plate line when the second switching component is activated. In some examples, a plurality of ferroelectric memory cells may be coupled with the plate line. The first capacitor may be configured to apply the first voltage to the plurality of ferroelectric memory cells and the voltage source may be configured to apply the second voltage to the plurality of ferroelectric memory cells when the second switching component is activated. In other examples, a seventh switching component may be coupled with the plate line. The first capacitor may be configured to apply the first voltage to the plate line, and the voltage source may be configured to apply the second voltage to the plate line when the seventh switching component is activated.

Figure 7:
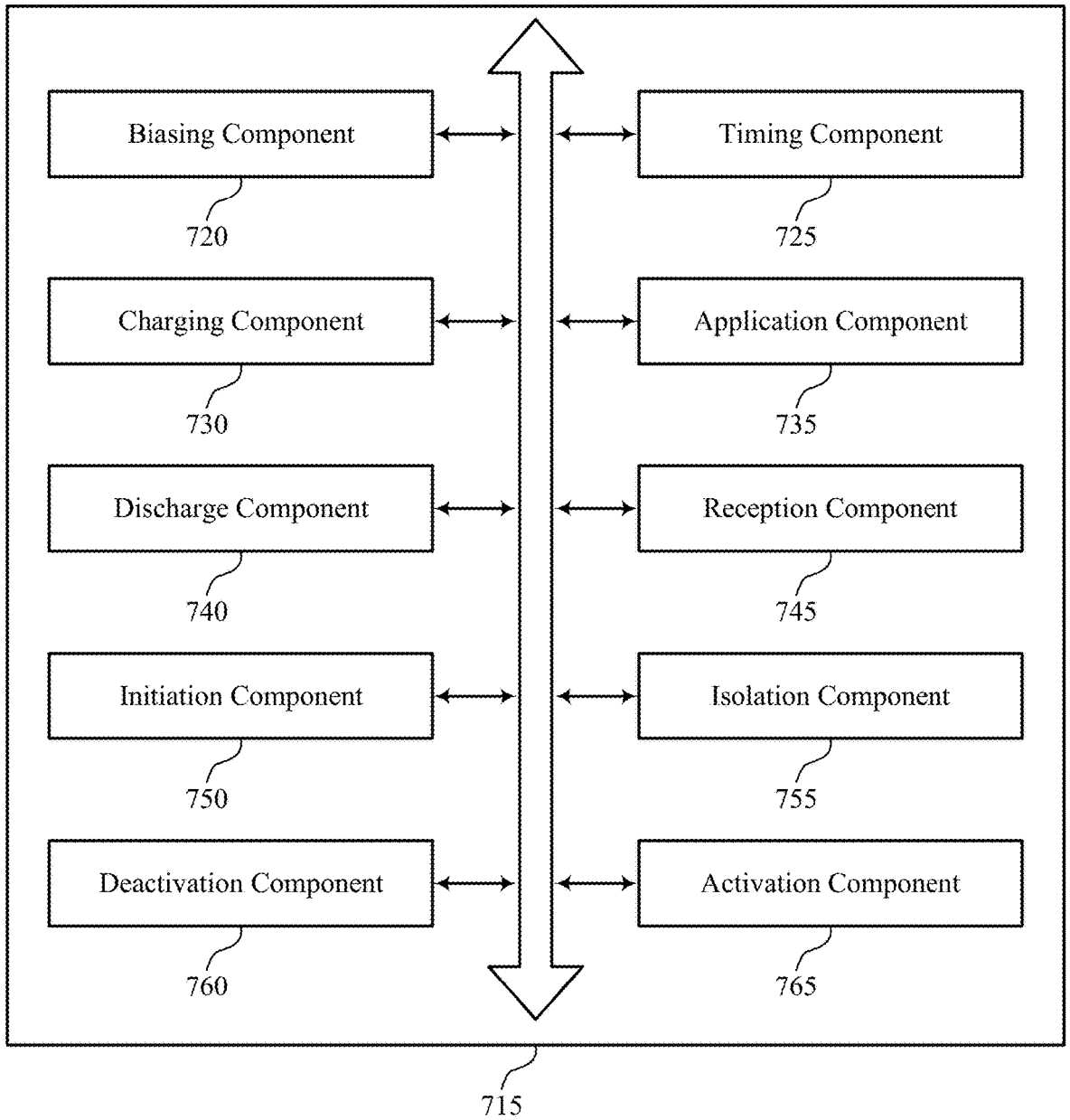
FIG. 7 shows a block diagram of a device that supports ferroelectric memory plate power reduction in accordance with examples of the present disclosure.

FIG. 7 shows a block diagram 700 of a memory controller 715 that supports ferroelectric memory plate power reduction in accordance with examples of the present disclosure. The memory controller 715 may be an example of aspects of a memory controller 815 described with reference to FIG. 8. The memory controller 715 may include biasing component 720, timing component 725, charging component 730, application component 735, discharge component 740, reception component 745, initiation component 750, isolation component 755, deactivation component 760, and activation component 765. Each of these modules may communicate, directly or indirectly, with one another (e.g., via one or more buses).

Charging component 730 may charge a capacitor from a ferroelectric memory cell coupled with a plate line. In some examples, the capacitor may be coupled with a first voltage source. In some examples, charging component 730 may charge the capacitor from the first voltage source by activating a third switching component coupled with the first voltage source before receiving the charge at the capacitor. In other examples, charging component 730 may charge the capacitor from the ferroelectric memory cell by (e.g., based in part on) activating the first switching component.

Application component 735 apply a first voltage to the ferroelectric memory cell by activating a first switching component coupled with the capacitor based on charging the capacitor from the ferroelectric memory cell. In other examples, application component 735 may apply the first voltage by (e.g., based in part on) activating the third switching component and deactivating the fifth switching component. In some examples, applying the third voltage may include activating the fourth switching component and deactivating the third switching component and the fifth switching component. In some examples, application component 735 may apply a third voltage to the ferroelectric memory cell after activating the third switching component.

In some examples, application component 735 may apply the first voltage to a second ferroelectric memory cell coupled with the plate line. In some examples, the capacitor may be coupled with the second ferroelectric memory cell through the plate line and a fifth switching component associated with the second ferroelectric memory cell. Application component 735 may apply, based on applying the first voltage, a second voltage to the ferroelectric memory cell by activating a second switching component coupled with the first voltage source. In some examples, application component 735 may apply a first voltage to the ferroelectric memory cell of the first subset of ferroelectric memory cells based on receiving the first charge.

In some examples, application component 735 may apply a second voltage to the capacitor from a first voltage source coupled with the plate line before discharging the ferroelectric memory cell. In other examples, application component 735 may apply a third voltage to the ferroelectric memory cell of the first subset of ferroelectric memory cells based on receiving the first charge. Additionally or alternatively, application component 735 may apply the second voltage to the second ferroelectric memory cell based on applying the first voltage to the second ferroelectric memory cell. In some examples, the first switching component may be associated with the ferroelectric memory cell. In some examples, the second voltage may be applied to the ferroelectric memory cell by decoupling the capacitor from the plate line. In other examples, applying the second voltage may include deactivating a first switching component coupled with the capacitor and the first voltage source.

Discharge component 740 may discharge a ferroelectric memory cell of a first subset of ferroelectric memory cells to a plate line. In some examples, discharging the ferroelectric memory cell of the first subset of ferroelectric memory cells to the plate line may include includes activating the second switching component.

Reception component 745 may receive a first charge at a capacitor coupled with the plate line based on discharging the ferroelectric memory cell of the first subset of ferroelectric memory cells.

Initiation component 750 may initiate charging the capacitor from the plurality of ferroelectric memory cells. In some examples, initiation component 750 may initiate applying a first voltage to at least one of a plurality of ferroelectric memory cells by activating a first switching component coupled with the capacitor. In other examples, initiation component 750 may initiate applying, based at least in part on applying the first voltage, a second voltage to the at least one of the plurality of ferroelectric memory cells by activating a second switching component coupled with the voltage source. Additionally or alternatively, initiation component 750 may initiate charging the capacitor by activating a third switching component coupled with the voltage source before receiving the charge at the capacitor. In other examples, initiation component 750 may initiate applying a third voltage to the at least one of the plurality of ferroelectric memory cells after activating the third switching component.

Isolation component 755 may isolate the ferroelectric memory cell from the capacitor and the first voltage source by deactivating the first switching component and the second switching component.

Deactivation component 760 may deactivate the third switching component while the first switching component is activated. In some examples, deactivation component 760 may deactivate the third switching component. In other examples, deactivation component 760 may deactivate a fourth switching component coupled with the plate line and the first voltage source. Additionally or alternatively, deactivation component 760 may deactivate the fifth switching component.

Activation component 765 may activate a fourth switching component while the third switching component is deactivated. In some examples, activation component 765 may activate a second switching component coupled with the capacitor and a virtual ground. In other examples, activation component 765 may activate a third switching component coupled with the capacitor and the plate line. Additionally or alternatively, activation component 765 may activate a fifth switching component coupled with the plate line and the virtual ground. In some examples, activating the fifth switching component may discharge the plate line. In other examples, activation component 765 may activate the third switching component.

Figure 8:
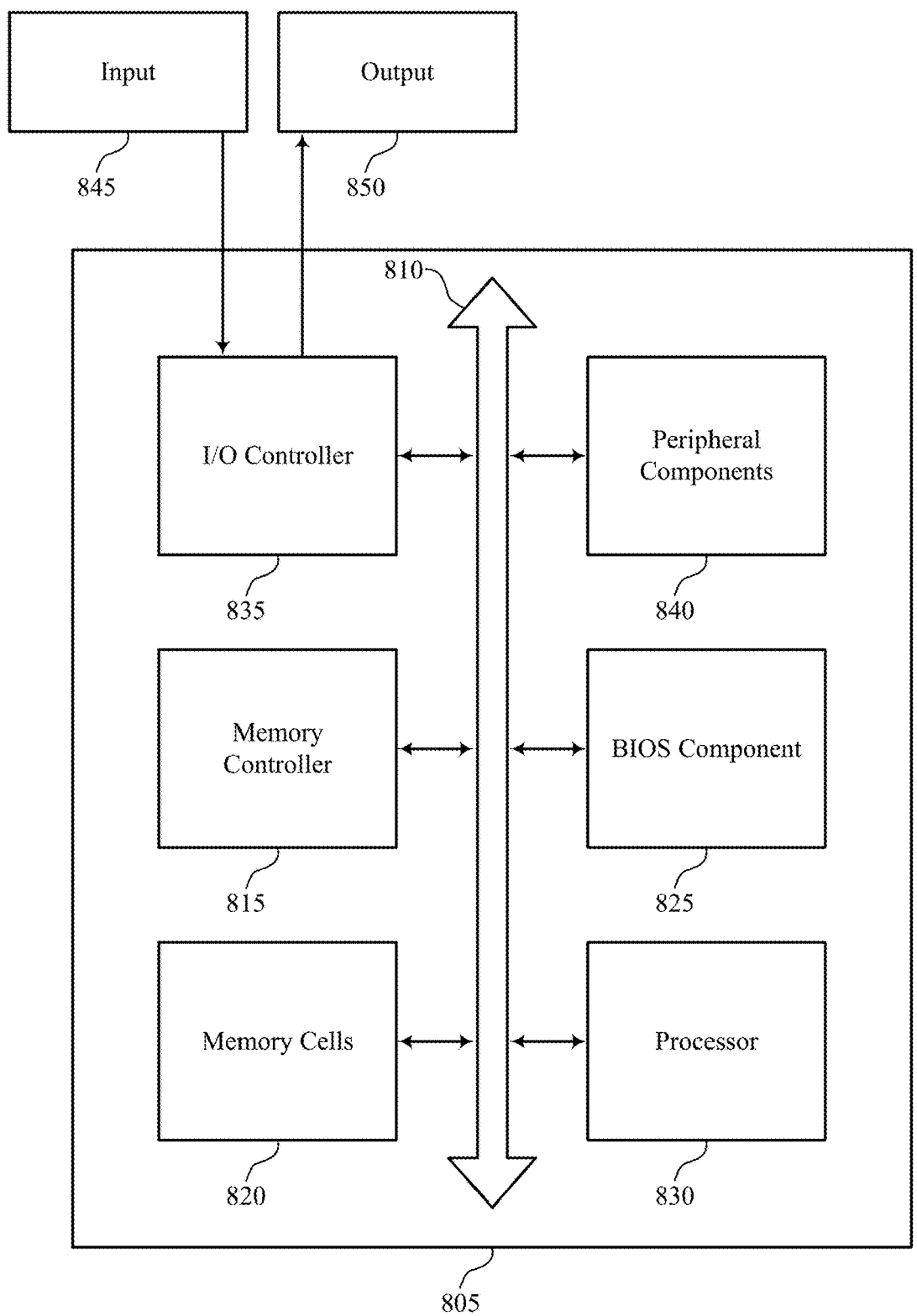
FIG. 8 illustrates a block diagram of a system including a section of a ferroelectric memory array that supports ferroelectric memory plate power reduction in accordance with examples of the present disclosure.

FIG. 8 shows a diagram of a system 800 including a device 805 that supports ferroelectric memory plate power reduction in accordance with examples of the present disclosure. Device 805 may be an example of or include the components of section of a ferroelectric memory array 100 as described above, e.g., with reference to FIG. 1. Device 805 may include components for bi-directional voice and data communications including components for transmitting and receiving communications, including memory controller 815, memory cells 820, basic input/output system (BIOS) component 825, processor 830, I/O controller 835, and peripheral components 840. These components may be in electronic communication via one or more buses (e.g., bus 810).

Memory controller 815 may operate one or more memory cells as described herein. Specifically, memory controller 815 may be configured to support ferroelectric memory plate power reduction. In some cases, memory controller 815 may include a row decoder, column decoder, or both, as described herein (not shown).

Memory cells 820 may store information (i.e., in the form of a logical state) as described herein.

BIOS component 825 be a software component that includes BIOS operated as firmware, which may initialize and run various hardware components. BIOS component 825 may also manage data flow between a processor and various other components, e.g., peripheral components, input/output control component, etc. BIOS component 825 may include a program or software stored in read only memory (ROM), flash memory, or any other non-volatile memory.

Processor 830 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 830 may be configured to operate a memory array using a memory controller. In other cases, a memory controller may be integrated into processor 830. Processor 830 may be configured to execute computer-readable instructions stored in a memory to perform various functions (e.g., functions or tasks supporting ferroelectric memory plate power reduction).

I/O controller 835 may manage input and output signals for device 805. I/O controller 835 may also manage peripherals not integrated into device 805. In some cases, I/O controller 835 may represent a physical connection or port to an external peripheral. In some cases, I/O controller 835 may utilize an operating system such as iOS®, ANDROID®, MS-DOS®, MS-WINDOWS®, OS/2®, UNIX®, LINUX®, or another known operating system. In other cases, I/O controller 835 may represent or interact with a modem, a keyboard, a mouse, a touchscreen, or a similar device. In some cases, I/O controller 835 may be implemented as part of a processor. In some cases, a user may interact with device 805 via I/O controller 835 or via hardware components controlled by I/O controller 835.

Peripheral components 840 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 845 may represent a device or signal external to device 805 that provides input to device 805 or its components. This may include a user interface or an interface with or between other devices. In some cases, input 845 may be managed by I/O controller 835, and may interact with device 805 via a peripheral component 840.

Output 850 may also represent a device or signal external to device 805 configured to receive output from device 805 or any of its components. Examples of output 850 may include a display, audio speakers, a printing device, another processor or printed circuit board, etc. In some cases, output 850 may be a peripheral element that interfaces with device 805 via peripheral component(s) 840. In some cases, output 850 may be managed by I/O controller 835

The components of device 805 may include circuitry designed to carry out their functions. This may include various circuit elements, for example, conductive lines, transistors, capacitors, inductors, resistors, amplifiers, or other active or inactive elements, configured to carry out the functions described herein. Device 805 may be a computer, a server, a laptop computer, a notebook computer, a tablet computer, a mobile phone, a wearable electronic device, a personal electronic device, or the like. Or device 805 may be a portion or aspect of such a device.

Figure 9:
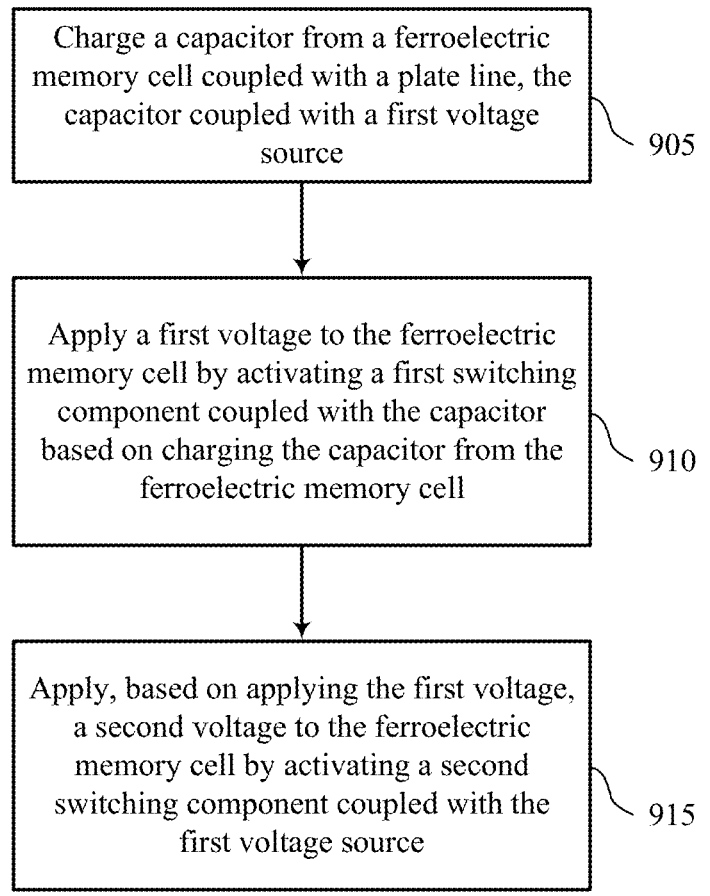
FIGS. 9 through 10 illustrate methods for ferroelectric memory plate power reduction in accordance with examples of the present disclosure.

FIG. 9 shows a flowchart illustrating a method 900 for ferroelectric memory plate power reduction in accordance with examples of the present disclosure. The operations of method 900 may be implemented by the methods and/or devices described herein. For example, the operations of method 900 may be performed by a memory controller as described with reference to FIG. 1.

At 905 a capacitor may be charged from a ferroelectric memory cell coupled with a plate line, the capacitor coupled with a first voltage source. The operations of 905 may be performed according to the methods described herein. In certain examples, aspects of the operations of 905 may be performed by a charging component as described with reference to FIG. 7.

At 910 a first voltage may be applied to the ferroelectric memory cell by activating a first switching component coupled with the capacitor based at least in part on charging the capacitor from the ferroelectric memory cell. The operations of 910 may be performed according to the methods described herein. In certain examples, aspects of the operations of 910 may be performed by an application component as described with reference to FIG. 7.

At 915 a second voltage may be applied to the ferroelectric memory cell by activating a second switching component coupled with the first voltage source. The operations of 915 may be performed according to the methods described herein. In certain examples, aspects of the operations of 915 may be performed by an application component as described with reference to FIG. 7.

In some cases, the method may include charging a capacitor from a ferroelectric memory cell coupled with a plate line, the capacitor coupled with a first voltage source. In other cases, the method may include applying the second voltage to the second ferroelectric memory cell based at least in part on applying the first voltage to the second ferroelectric memory cell, wherein the first switching component is associated with the ferroelectric memory cell. Additionally or alternatively, the method may include applying, based at least in part on applying the first voltage, a second voltage to the ferroelectric memory cell by activating a second switching component coupled with the first voltage source.

In some cases, the method may include isolating the ferroelectric memory cell from the capacitor and the first voltage source by deactivating the first switching component and the second switching component. In other cases, the second voltage may be applied to the ferroelectric memory cell by decoupling the capacitor from the plate line. In some cases, the method may include charging the capacitor from the first voltage source by activating a third switching component coupled with the first voltage source before receiving the charge at the capacitor. In other examples, the method may include applying a third voltage to the ferroelectric memory cell after activating the third switching component.

In some cases, the method may include applying a first voltage to the ferroelectric memory cell by activating a first switching component coupled with the capacitor based at least in part on charging the capacitor from the ferroelectric memory cell. In some examples, the method may include deactivating a fourth switching component coupled with the capacitor while the first switching component is deactivated. Additionally or alternatively, the method may include charging the capacitor from the ferroelectric memory cell is based at least in part on activating the first switching component. In other cases, the method may include deactivating the third switching component while the first switching component is activated.

In some examples, the method may include activating the fourth switching component while the third switching component is deactivated. In some cases, the method may include applying the first voltage to a second ferroelectric memory cell coupled with the plate line, where the capacitor coupled with the second ferroelectric memory cell through the plate line and a fifth switching component associated with the second ferroelectric memory cell.

Figure 10:
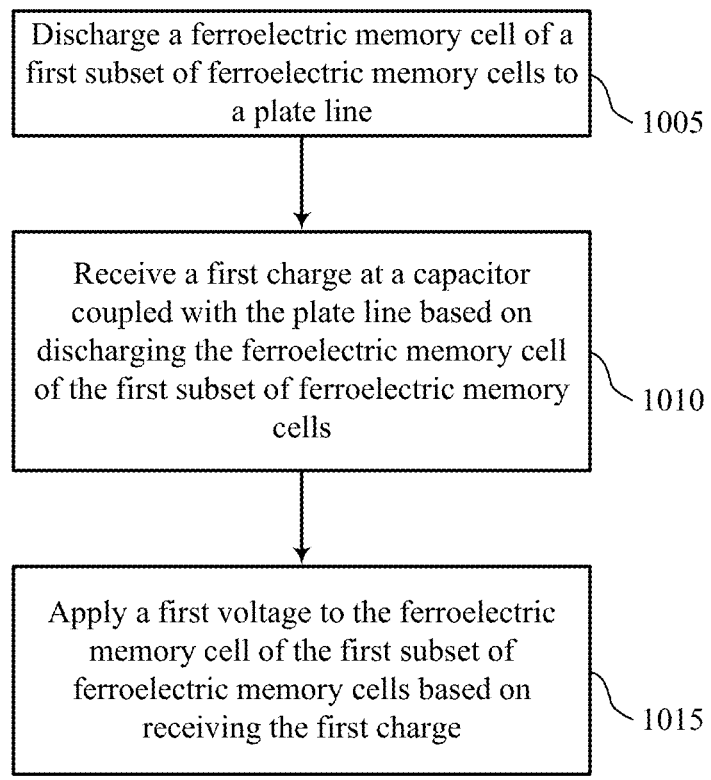

FIG. 10 shows a flowchart illustrating a method 1000 for ferroelectric memory plate power reduction in accordance with examples of the present disclosure. The operations of method 900 may be implemented by the methods and/or devices described herein. For example, the operations of method 900 may be performed by a memory controller as described with reference to FIG. 1.

At 1005 a ferroelectric memory cell of a first subset of ferroelectric memory cells may be discharged to a plate line. The operations of 1005 may be performed according to the methods described herein. In certain examples, aspects of the operations of 1005 may be performed by a discharge component as described with reference to FIG. 7.

At 1010 a first charge may be received at a capacitor coupled with the plate line based at least in part on discharging the ferroelectric memory cell of the first subset of ferroelectric memory cells. The operations of 1010 may be performed according to the methods described herein. In certain examples, aspects of the operations of 1010 may be performed by a reception component as described with reference to FIG. 7.

At 1015 a first voltage may be applied to the ferroelectric memory cell of the first subset of ferroelectric memory cells based at least in part on receiving the first charge. The operations of 1015 may be performed according to the methods described herein. In certain examples, aspects of the operations of 1015 may be performed by an application component as described with reference to FIG. 7.

In some cases, the method may include discharging a ferroelectric memory cell of a first subset of ferroelectric memory cells to a plate line. In some examples, the method may include applying the first voltage by activating the third switching component and deactivating the fifth switching component, and applying the third voltage includes activating the fourth switching component and deactivating the fifth switching component. In some cases, the method may include applying a first voltage to the ferroelectric memory cell of the first subset of ferroelectric memory cells based at least in part on receiving the first charge.

In some examples, the method may include applying a second voltage to the capacitor coupled with the plate line before discharging the ferroelectric memory cell, the second voltage being based at least in part on applying the first voltage applied to the ferroelectric memory cell of the first subset of ferroelectric memory cells. In some examples, the second voltage may be applied to the capacitor from the charged ferroelectric memory cell initially charged by the first voltage source. In some examples, applying the second voltage may include deactivating a first switching component coupled with the capacitor and the first voltage source, activating a second switching component coupled with the capacitor and a virtual ground, and activating a third switching component coupled with the capacitor and the plate line. Additionally or alternatively, the method may include applying a third voltage to the ferroelectric memory cell of the first subset of ferroelectric memory cells based at least in part on receiving the first charge. In some cases, applying the second voltage may include activating a first switching component coupled with the capacitor and the first voltage source. In some examples, the method may include deactivating the third switching component and activating a fifth switching component coupled with the plate line and the virtual ground. In some examples, activating the fifth switching component may discharge the plate line.

In some examples, the method may include receiving a first charge at a capacitor coupled with the plate line based at least in part on discharging the ferroelectric memory cell of the first subset of ferroelectric memory cells. In some cases, the method may include deactivating a third switching component coupled with the capacitor and the plate line. In other cases, discharging the ferroelectric memory cell of the first subset of ferroelectric memory cells to the plate line may include activating the third switching component.

Additionally or alternatively, the method may include deactivating a fourth switching component coupled with the plate line and the first voltage source. In some cases, the method may include deactivating a fifth switching component coupled with the plate line and the virtual ground. In other examples, the method may include deactivating a second switching component coupled with the capacitor and a virtual ground.

It should be noted that the methods described above describe possible implementations, and that the operations and the steps may be rearranged or otherwise modified and that other implementations are possible. Further, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   discharging a ferroelectric memory cell of a first subset of ferroelectric memory cells to a plate line;
   receiving, based at least in part on discharging the ferroelectric memory cell of the first subset of ferroelectric memory cells, a first charge at a capacitor coupled with the plate line; and
   applying a first voltage to the ferroelectric memory cell of the first subset of ferroelectric memory cells based at least in part on receiving the first charge.

2. The method of claim 1, further comprising:
   applying a second voltage to the capacitor coupled with the plate line before discharging the ferroelectric memory cell, the second voltage being based at least in part on applying the first voltage to the ferroelectric memory cell of the first subset of ferroelectric memory cells; and
   applying a third voltage to the ferroelectric memory cell of the first subset of ferroelectric memory cells based at least in part on applying the second voltage to the capacitor.

3. The method of claim 2, wherein applying the second voltage comprises:
   deactivating a first switching component coupled with the capacitor and a first voltage source;
   activating a second switching component coupled with the capacitor and a virtual ground; and
   activating a third switching component coupled with the capacitor and the plate line.

4. The method of claim 3, further comprising:
   deactivating the third switching component; and
   activating a fifth switching component coupled with the plate line and the virtual ground, wherein activating the fifth switching component discharges the plate line.

5. The method of claim 4, wherein discharging the ferroelectric memory cell of the first subset of ferroelectric memory cells to the plate line comprises:
   activating the second switching component;
   activating the third switching component;
   deactivating a fourth switching component coupled with the plate line and the first voltage source; and
   deactivating the fifth switching component.

6. The method of claim 5, wherein applying the first voltage comprises activating the third switching component and deactivating the fifth switching component, and wherein applying the third voltage comprises activating the fourth switching component and deactivating the third switching component and the fifth switching component.

7. An apparatus, comprising:
   a ferroelectric memory cell;
   a plate line coupled with the ferroelectric memory cell;
   a capacitor coupled with the plate line; and
   a controller coupled with the ferroelectric memory cell, wherein the controller is operable to:
   discharge the ferroelectric memory cell to the plate line, wherein the capacitor is configured to receive a first charge based at least in part on discharging the ferroelectric memory cell to the plate line; and
   apply a first voltage to the ferroelectric memory cell based at least in part on the capacitor receiving the first charge.

8. The apparatus of claim 7, wherein the controller is operable to:

apply a second voltage to the capacitor before discharging the ferroelectric memory cell, wherein the second voltage is based at least in part on applying the first voltage to the ferroelectric memory cell; and apply a third voltage to the ferroelectric memory cell based at least in part on applying the second voltage to the capacitor.

9. The apparatus of claim 8, wherein, to apply the second voltage, the controller is operable to:
deactivate a first switching component coupled with the capacitor and a first voltage source;
activate a second switching component coupled with the capacitor and a virtual ground; and
activate a third switching component coupled with the capacitor and the plate line.

10. The apparatus of claim 9, wherein the controller is operable to:
deactivate the third switching component; and
activate a fifth switching component coupled with the plate line and the virtual ground, wherein activating the fifth switching component discharges the plate line.

11. The apparatus of claim 10, wherein, to discharge the ferroelectric memory cell to the plate line, the controller is operable to:
activate the second switching component;
activate the third switching component;
deactivate a fourth switching component coupled with the plate line and the first voltage source; and
deactivate the fifth switching component.

12. The apparatus of claim 11, wherein applying the first voltage comprises activating the third switching component and deactivating the fifth switching component, and wherein applying the third voltage comprises activating the fourth switching component and deactivating the third switching component and the fifth switching component.

13. A method, comprising:
discharging a ferroelectric memory cell to a plate line;
charging, based at least in part on discharging the ferroelectric memory cell, a capacitor coupled with the plate line;
activating, based at least in part on charging the capacitor, a first switching component coupled with the capacitor; and
applying a first voltage to the ferroelectric memory cell based at least in part on activating the first switching component.

14. The method of claim 13, wherein the capacitor is coupled with a first voltage source, the method further comprising:
activating a second switching component coupled with the first voltage source based at least in part on applying the first voltage to the ferroelectric memory cell; and
applying a second voltage to the ferroelectric memory cell based at least in part on activating the second switching component.

15. The method of claim 14, further comprising:
deactivating the first switching component based at least in part on applying the second voltage to the ferroelectric memory cell; and
isolating the ferroelectric memory cell from the capacitor based at least in part on deactivating the first switching component.

16. The method of claim 14, further comprising:
isolating the capacitor from the plate line, wherein applying the second voltage to the ferroelectric memory cell is based at least in part on isolating the capacitor from the plate line.

17. The method of claim 14, further comprising:
activating a third switching component coupled with the first voltage source based at least in part on charging the capacitor coupled with the plate line; and
charging, for a second time, the capacitor using the first voltage source based at least in part on activating the third switching component.

18. The method of claim 17, further comprising:
applying a third voltage to the ferroelectric memory cell based at least in part on charging the capacitor for the second time using the first voltage source.

19. The method of claim 13, further comprising:
activating a fourth switching component coupled with the plate line and a virtual ground based at least in part on applying the first voltage to the ferroelectric memory cell; and
discharging the plate line based at least in part on activating the fourth switching component.

20. The method of claim 13, further comprising:
increasing a voltage of the plate line to a first voltage level based at least in part on charging the capacitor; and
increasing the voltage of the plate line from the first voltage level to a second voltage level based at least in part on applying the first voltage.

* * * * *